(12) United States Patent
Ishii et al.

(10) Patent No.: US 10,110,685 B2
(45) Date of Patent: Oct. 23, 2018

(54) POSITION INFORMATION AUTHORING SYSTEM, POSITION INFORMATION AUTHORING APPARATUS, AND POSITION INFORMATION AUTHORING METHOD

(71) Applicant: YOKOGAWA ELECTRIC CORPORATION, Musashino-shi, Tokyo (JP)

(72) Inventors: Yosuke Ishii, Tokyo (JP); Nobuo Okabe, Tokyo (JP); Kazunori Miyazawa, Tokyo (JP); Yukiyo Akisada, Tokyo (JP)

(73) Assignee: Yokogawa Electric Corporation, Musashino, Tokyo (JP)

( * ) Notice: Subject to any disclaimer, the term of this patent is extended or adjusted under 35 U.S.C. 154(b) by 121 days.

(21) Appl. No.: 15/245,290

(22) Filed: Aug. 24, 2016

(65) Prior Publication Data

US 2017/0064016 A1 Mar. 2, 2017

(30) Foreign Application Priority Data

Aug. 27, 2015 (JP) ................................. 2015-168222

(51) Int. Cl.
| | | |
|---|---|---|
| *H04W 24/00* | (2009.01) | |
| *H04L 29/08* | (2006.01) | |
| *H04W 4/02* | (2018.01) | |
| *G06F 17/50* | (2006.01) | |

(52) U.S. Cl.
CPC ............ *H04L 67/18* (2013.01); *G06F 17/50* (2013.01); *H04W 4/02* (2013.01)

(58) Field of Classification Search
None
See application file for complete search history.

(56) References Cited

U.S. PATENT DOCUMENTS

| 2007/0143013 A1 | 6/2007 | Breen |
|---|---|---|
| 2011/0246338 A1 | 10/2011 | Eich |
| 2013/0060351 A1 | 3/2013 | Imming et al. |

FOREIGN PATENT DOCUMENTS

| JP | 2001-251674 A | 9/2001 |
|---|---|---|
| JP | 2003-305276 A | 10/2003 |
| JP | 2012-252499 A | 12/2012 |
| JP | 2013-55662 A | 3/2013 |

*Primary Examiner* — Suhail Khan
(74) *Attorney, Agent, or Firm* — Sughrue Mion, PLLC

(57) ABSTRACT

A position information authoring system according to one aspect of the present invention includes a plurality of position information devices in a plant and a position information authoring apparatus. Each of the plurality of position information devices is configured to input a position information into the position information authoring apparatus, the position information represents a three-dimensional absolute position of each of the plurality of position information devices. The position information authoring apparatus is configured to manage a physical position of each physical equipment in the plant and physical positions of the plurality of position information devices, based on a three-dimensional plant model which includes virtual equipments and marks a virtual position of each of the plurality of position information devices.

17 Claims, 12 Drawing Sheets

POSITION INFORMATION AUTHORING SYSTEM, POSITION INFORMATION AUTHORING APPARATUS, AND POSITION INFORMATION AUTHORING METHOD

BACKGROUND OF THE INVENTION

Field of the Invention

The present invention relates to a position information authoring system, a position information authoring apparatus, and a position information authoring method for grasping a position of equipment arranged in a plant.

Priority is claimed on Japanese Patent Application No. 2015-168222, filed on Aug. 27, 2015, the contents of which are incorporated herein by reference.

Description of Related Art

Recently, there is a global trend on production sites in which Internet of Things (Iot) technology has been introduced, and thereby activities for innovating operations on production sites have been developed. A positioning technology (a technique for acquiring position information) as represented by a Global Positioning System (GPS) has been a focus of attention as one of techniques required in operation innovation activities on production sites.

For example, United States Patent Application, Publication No. 2007/0143013 (hereinafter, referred to as "Patent Document 1") has proposed a systematic technique that utilizes position information acquired by measurement of a positioning system, such as a GPS, which uses satellites (positioning satellites). In the technique disclosed in Patent Document 1, a position information terminal, which includes a positioning sensor such as a GPS sensor for receiving radio waves emitted from a positioning satellite, receives the radio waves emitted from the positioning satellite at constant or arbitrary timing to acquire position information, and identifies an actual position based on the acquired position information. In the technique disclosed in Patent Document 1, a processing in accordance with the current position of the position information terminal is performed based on a virtual geographical borderline set on a map (geofence: virtual geographical borderline) and the identified actual position. For example, the technique disclosed in Patent Document 1 can provide information such as equipment around the current position of the position information terminal, in other words, the current position of a user using the position information terminal, and the service contents of the equipment.

As another technique for utilizing position information, which is acquired by measurement of a positioning system using a positioning satellite, for example, Japanese Unexamined Patent Application, First Publication No. 2003-305276 (hereinafter, referred to as "Patent Document 2") has proposed a systematic technique for superimposing and representing a virtual space and an actual space. In the technique disclosed in Patent Document 2, a position (coordinate) in the virtual space and the a position (latitude, longitude, height) in the actual space are associated with each other, and thereby virtual things in the virtual space can be represented as if the virtual things are in the actual space.

In a plant including various pieces of equipment, the equipment arranged in the plant and the measured results of a measurement instrument installed on a specific site of each equipment are confirmed, and thereby routine inspection works for the equipment and works for handling troubles such as failures and defects are performed. Workers for the works visit the specific site such as equipment, which is a site of work, and performs the works. Therefore, as one of the activities of operation innovation in the plan, the association of the position of each equipment arranged in the plant with the work to be performed in the equipment is considered. Generally, a site of a plant is large, and a plurality of equipment and a plurality of pipes can become confusing in a plant. In addition, changes to equipment and a measurement instrument in a plant such as movement and addition are performed. Therefore, it is desirable for workers to accurately visit a specific site, which is a site of work.

However, the measurement accuracy of a positioning system using a positioning satellite such as a GPS is low, the position represented by position information acquired by the measurement based on radio waves emitted from the positioning satellite includes an error of a few meters (generally, it is considered to be 5 m to 10 m). Therefore, it is difficult to identify a precise position in a plant only by identifying a position acquired by a position information terminal as an actual position, as the technique disclosed in Patent Document 1. Recently, a position correction technique such as an Assisted GPS: A-GPS) that corrects results (positions) measured by a GPS using radio waves in wireless communication such as a Wi-Fi (registered trademark) has been proposed. However, since the measurement error of the positioning system using the positioning satellite such as a GPS is not constant and the measurement accuracy varies depending on the area, weather, position, or the like, it is difficult to guarantee acquirement of position information with stable accuracy even if the position correction technique is applied to the positioning system.

Under an environment in which radio waves emitted from a positioning satellite cannot be received, for example, in the shadows of equipment which the radio waves emitted from the positioning satellite do not reach or in equipment (room inside), the measurement by the positioning system using the positioning satellite cannot be performed. Therefore, recently, as a means for measuring an indoor position, an indoor position measuring technique also has been proposed that measures positions using an Indoor MEssaging System (IMPS), Wi-Fi (registered trademark), Bluetooth (registered trademark), or the like. In addition, recently, a technique for identifying a position using a distance image sensor also has been proposed. However, since, in any positioning techniques, a system combining equipment for emitting position information and a sensor is used in a similar way to the system combining the positioning satellite and the positioning sensor disclosed in Patent Document 1, it is difficult to greatly improve the measurement accuracy of the current positioning system such as a GPS which uses positioning satellites.

It is also considered to improve the correction accuracy by improving the performance of a sensor included in a position information terminal to increase the measurement accuracy, or by increasing the number of access points of Wi-Fi (registered trademark) to increase points to be measured per unit area. However, from the aspect of cost, it is not useful to generically apply the method for improving measurement accuracy accompanied by such capability improvement or equipment investment to a plant environment, which has a large site and a strict restriction when electrical devices are installed. The larger the site of a plant is, the lower the practical utility is.

In a plant, for example, a measurement of height is also needed in order to represent the height of a place on which a measure is installed. For example, in addition to latitude and longitude, a GPS can also measure height. However, it is necessary to receive more radio waves from a GPS satellite when height measurement is performed by a GPS, than those when latitude and longitude measurement is performed, the result (position) accuracy of the height measurement is lower than that of the latitude and longitude measurement, and generally, it is considered to include an error of about 15 m. The above-described indoor position measuring technique is also applicable to the height measurement. Therefore, in a plant requiring stereoscopic measurement, in other words, three-dimensional measurement, the lack of height information or the low measurement accuracy narrows the scope of activity for utilizing position information in the operation innovation.

SUMMARY OF THE INVENTION

One aspect of the present invention provides a position information authoring system, a position information authoring apparatus, and a position information authoring method, for managing, using a three-dimensional model, the position of each equipment installed in a plant.

A position information authoring system according to one aspect of the present invention may include a plurality of position information devices in a plant and a position information authoring apparatus. Each of the plurality of position information devices may be configured to input a position information into the position information authoring apparatus, the position information represents a three-dimensional absolute position of each of the plurality of position information devices. The position information authoring apparatus may be configured to manage a physical position of each physical equipment in the plant and physical positions of the plurality of position information devices, based on a three-dimensional plant model which includes virtual equipments and marks a virtual position of each of the plurality of position information devices.

In the above-stated position information authoring system, the position information authoring apparatus may be configured to identify a three-dimensional coordinate representing the virtual position of the virtual equipment or the virtual position of each of the plurality of position information devices and the position information output from each of the plurality of position information devices, and to manage the physical position of the physical equipment and the physical positions of the plurality of position information devices based on the identified coordinate.

In the above-stated position information authoring system, the position information authoring apparatus may include a position information acquirer configured to acquire the position information from the plurality of position information devices, a coordinate converter configured to mutually convert the virtual position represented by the coordinate extracted from the three-dimensional plant model and the three-dimensional absolute position included in the position information to identify the virtual position and the physical position, a three-dimensional model data storage storing the three-dimensional plant model, and a position information database storing position information data in which the virtual position and the physical position are associated with each other, the virtual position and the actual position being identified by the coordinate converter for each equipment and each of the plurality of position information devices.

In the above-stated position information authoring system, each of plurality of position information devices may include at least one of a measuring device and a mobile terminal device. The measuring device may be configured to measure operation state of the physical equipment at which the measuring device is installed and to input measured results and the position information into the position information authoring apparatus. The mobile terminal device may be configured to display works with respect to the equipment and to input work results of the works and the position information into the position information authoring apparatus. The position information authoring apparatus may be configured to associate and store related information with the position information data, the related information including at least one of information input into the virtual position in the three-dimensional plant model, the measured results, and the work results.

In the above-stated position information authoring system, the position information authoring apparatus may be configured to display the related information associated with the position information data at the associated virtual position in the three-dimensional plant model.

In the above-stated position information authoring system, each of plurality of position information devices may include a mobile terminal device configured to display works with respect to the equipment and to input work results of the works and the position information into the position information authoring apparatus, and the position information authoring apparatus is configured to associate and store related information with the position information data, the related information including at least one of information input into the virtual position in the three-dimensional plant model and the work results.

In the above-stated position information authoring system, the position information authoring apparatus may be configured to input the related information associated with the position information data into the mobile terminal device adjacent to the physical position associated with the position information data. The mobile terminal device may be configured to display the related information output from the position information authoring apparatus.

In the above-stated position information authoring system, the mobile terminal device may be configured to display the three-dimensional plant model output from the position information authoring apparatus and to input, into the position information authoring apparatus, a modification information for modifying a display position which is input with respect to the displayed three-dimensional plant model. The position information authoring apparatus may be configured to modify the identified virtual position and physical position based on the modification information.

In the above-stated position information authoring system, the mobile terminal device may include a measure configured to measure the three-dimensional absolute position based on radio waves emitted from positioning satellites, and the mobile terminal device is configured to input the absolute position measured by the measure as the position information into the position information authoring apparatus.

In the above-stated position information authoring system, the coordinate converter may be configured to mutually convert the coordinate extracted from the three-dimensional plant model and a set of latitude, longitude, and height included in the position information.

A position information authoring apparatus according to one aspect of the present invention may be configured to manage a physical position of each physical equipment in a plant and physical positions of a plurality of position information devices based on a three-dimensional plant model, each of the plurality of position information devices inputting a position information into the position information authoring apparatus, the position information representing a three-dimensional absolute position of each of the plurality of position information devices, the three-dimensional plant model including virtual equipments and marking a virtual position of each of the plurality of position information devices.

In the above-stated position information authoring apparatus, the position information authoring apparatus may be configured to identify a three-dimensional coordinate representing the virtual position of the virtual equipment or the virtual position of each of the plurality of position information devices and the position information output from each of the plurality of position information devices, and to manage the physical position of the physical equipment and the physical positions of the plurality of position information devices based on the identified coordinate.

In the above-stated position information authoring apparatus, the position information authoring apparatus may include a position information acquirer configured to acquire the position information from the plurality of position information devices, a coordinate converter configured to mutually convert the virtual position represented by the coordinate extracted from the three-dimensional plant model and the three-dimensional absolute position included in the position information to identify the virtual position and the physical position, a three-dimensional model data storage storing the three-dimensional plant model, and a position information database storing position information data in which the virtual position and the physical position are associated with each other, the virtual position and the actual position being identified by the coordinate converter for each equipment and each of the plurality of position information devices.

In the above-stated position information authoring apparatus, the position information authoring apparatus may be configured to associate and store related information with the position information data, the related information including at least one of information input into the virtual position in the three-dimensional plant model, measured results output from the plurality of position information devices, and work results output from the plurality of position information devices.

In the above-stated position information authoring apparatus, the position information authoring apparatus may be configured to display the related information associated with the position information data at the associated virtual position in the three-dimensional plant model.

A position information authoring method according to one aspect of the present invention may include acquiring position information from a plurality of position information devices in a plant, the position information representing a three-dimensional absolute position of each of the plurality of position information devices, and managing a physical position of each physical equipment in the plant and physical positions of the plurality of position information devices based on a three-dimensional plant model, the three-dimensional plant model including virtual equipments and marking a virtual position of each of the plurality of position information devices.

In the above-stated position information authoring method, managing the physical position of each physical equipment in the plant and the physical positions of the plurality of position information devices may include identifying a three-dimensional coordinate representing the virtual position of the virtual equipment or the virtual position of each of the plurality of position information devices and the position information output from each of the plurality of position information devices, and managing the physical position of the physical equipment and the physical positions of the plurality of position information devices based on the identified coordinate.

In the above-stated position information authoring method, managing the physical position of each physical equipment in the plant and the physical positions of the plurality of position information devices may include acquiring the position information from the plurality of position information devices, converting the virtual position represented by the coordinate extracted from the three-dimensional plant model and the three-dimensional absolute position included in the position information mutually to identify the virtual position and the physical position, storing the three-dimensional plant model, and storing position information data in which the identified virtual position and physical position are associated with each other for each equipment and each of the plurality of position information devices.

In the above-stated position information authoring method, storing the position information data may include associating and storing related information with the position information data, the related information including at least one of information input into the virtual position in the three-dimensional plant model, measured results output from the plurality of position information devices, and work results output from the plurality of position information devices.

The above-stated position information authoring method may further include displaying the related information associated with the position information data at the associated virtual position in the three-dimensional plant model.

One aspect of the present invention can manage, using a three-dimensional model, the position of each equipment installed in a plant.

DETAILED DESCRIPTION OF THE INVENTION

Figure 1:
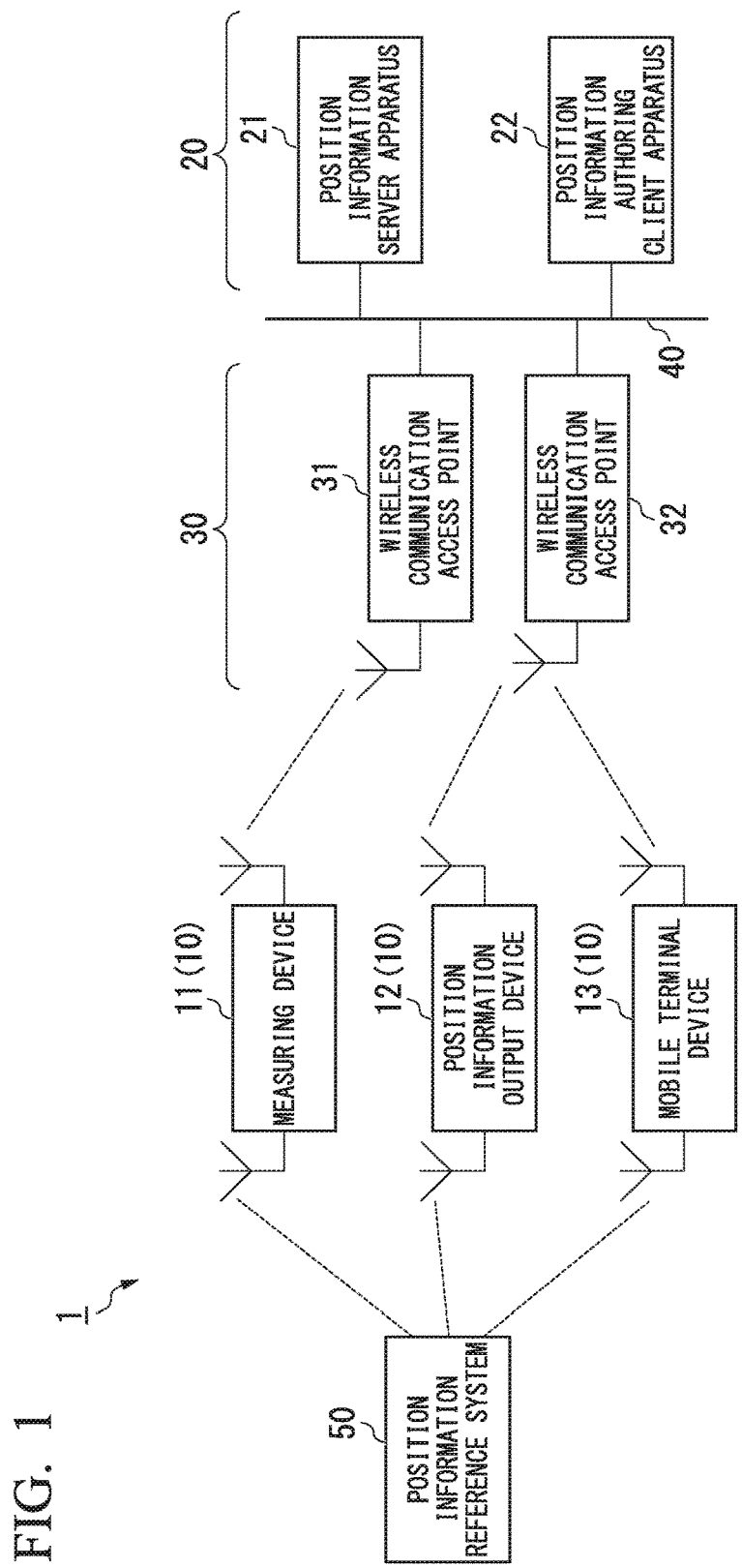
FIG. 1 is a block diagram schematically showing a configuration of a position information authoring system according to an embodiment of the present invention.

Hereinafter, an embodiment of the present invention will be described with reference to the drawings. FIG. 1 is a block diagram schematically showing a configuration of a position information authoring system according to an embodiment of the present invention. A position information authoring system 1 includes a plurality of position information devices 10 and a position information authoring apparatus 20. FIG. 1 shows an example in which each of a measuring device 11, a position information output device 12, and a mobile terminal device 13 is a respective a plurality of position information devices 10 included in the position information authoring system 1. FIG. 1 shows an example in which a position information server apparatus 21 and a position information authoring client apparatus 22 are included in the position information authoring apparatus 20, which is included in the position information authoring system 1.

FIG. 1 shows the constitution of the position information authoring system 1 in which each position information device 10 is connected to the position information authoring apparatus 20 via a position information relay device 30 and a backbone network 40. FIG. 1 shows an example in which a plurality of wireless communication access points associated with at least one position information device 10 among a plurality of position information devices 10 are included in the position information relay device 30. Specifically, a wireless communication access point 31 associated with the measuring device 11 and a wireless communication access point 32 associated with the position information output device 12 and the mobile terminal device 13 are included in the position information relay device 30.

FIG. 1 shows the constitution of the position information authoring system 1 in which each position information device 10 receives radio waves emitted from a position information reference system 50 to grasp a position at which each position information device 10 is installed.

The position information authoring system 1 manages each equipment installed in a plant using a three-dimensional plant model, which virtually represents each equipment using a three-dimensional model. The three-dimensional plant model is a virtual spatial environment model which schematically represents positions of equipment (physical equipment) or environment in an actual plant using a three-dimensional graphic virtual model. The three-dimensional plant model may be created using, for example, a figure of a three-dimensional Computer Aided Design (CAD), which is previously generated when a plant is designed or constructed, or measured results (spatial data), which are acquired by a three-dimensional measurement using a three-dimensional laser scanner after a plant is constructed. Since the three-dimensional plant model can be created using existing techniques, the detail description of the method for creating the three-dimensional plant model is omitted. Various information with regard to each equipment installed in the plant is associated with the three-dimensional plant model. The plant includes, in addition to an industrial plant for refining petroleum or generating chemical products, a plant for managing and controlling a wellhead such as a gas field and oil field and its surroundings, a plant for managing and controlling an electrical power generation such as water power, fire power, and nuclear power, a plant for managing and controlling an energy harvesting such as photovoltaic power generation and wind-power generation, and a plant for managing and controlling a water and sewerage, a dam, and the like.

The position information authoring system 1 associates position information in an actual space which represents the absolute position of each position information device 10, such as latitude, longitude, and height, with position information in a virtual space which represents the virtual position in the three-dimensional plant model, such as coordinates, to manage the position of each equipment installed in the plant. In other words, the position information authoring system 1 converts between the actual position (physical position) in the plant and the virtual position in the three-dimensional plant model to manage the position of each equipment installed in the plant. The position information authoring system 1 manages the operation state or maintenance state of each equipment installed in the plant based on various information associated with each equipment (virtual equipment) in the three-dimensional plant model. Each equipment actually installed in the plant operates based on the control data transmitted via the backbone network 40. The backbone network 40 is a network interface such as a wired Local Area Network (LAN) installed in the plant. In addition to the position information relay device 30 and the position information authoring apparatus 20 shown in FIG. 1, each equipment, which is installed in the plant and to be managed by the position information authoring system 1, is connected to the backbone network 40.

The position information reference system 50 provides information to each position information device 10 (in FIG. 1, the information is provided by radio waves). The information is referred by each position information device 10 so that each position information device 10 grasps the position at which each position information device 10 is installed. The position information reference system 50 is, for example, equipment of a public positioning system (infrastructure) using an artificial satellite (positioning satellite) such as a GPS satellite which emits Global Positioning System (GPS) signals (radio waves), a public or private equipment such as an IMES transmitter which emits signals (radio waves) similar to GPS signals, or the like.

In the present embodiment, the equipment of the position information reference system 50 to be used by the position information authoring system 1 is not specified. Hereinafter, a description will be provided for the case in which the equipment of the position information reference system 50 is a GPS positioning system. Hereinafter, information, which the position information reference system 50 to be used by the position information authoring system 1 provides by radio waves and is referred to grasp positions, is referred to as "position information signals".

The position information device 10 inputs the position information, which represents the own position, into the position information authoring apparatus 20. As described above, the position information device 10 includes the measuring device 11, the position information output device 12, and the mobile terminal device 13. The position information device 10 inputs (transmits), into the position information authoring apparatus 20, the position information acquired by measuring the position at which the position information device 10 is installed. The position information device 10 inputs (transmits), into the position information authoring apparatus 20, the position information including identification information exclusively assigned to identify each position information device 10.

The position information device 10 is not limited to the device that measures the position at which the position information device 10 is installed based on the radio waves emitted from the position information reference system 50 as shown in FIG. 1. The position information device 10 may include a device for outputting (transmitting) previously set position information representing own position.

The measuring device 11 is installed in, for example, a productive equipment arranged in a plant. The measuring device 11 measures the operation state of the productive equipment, for example, "voltage", "temperature", "flow rate", "magnetism", "pressure", or the like, at the installed position. In addition, the measuring device 11 inputs (transmits) position information acquired by measuring the position at which the measuring device 11 is installed (the position corresponds to a position of the productive equipment arranged in the plant) based on position information signals included in radio waves emitted from the position information reference system 50 and the measured results of the productive equipment into the position information authoring apparatus 20. In the position information authoring system 1 shown in FIG. 1, the measuring device 11 transmits, by wireless communication, the position information and the measured results to the wireless communication access point 31 included in the position information relay device 30. Therefore, the position information (the position at which the productive equipment is arranged) and the measured results output from the measuring device 11 are output (transferred) to the position information authoring apparatus 20 via the wireless access point 31 and the backbone network 40. The measuring device 11 may have no measuring function and input (transmit) previously set position information representing own position and the measured results to the position the information authoring apparatus 20.

The position information output device 12 is installed in, for example, equipment, which does not need the measurement of operation state of a pipe or tank arranged in the plant, or equipment, which in not a productive equipment, such as a living room. The position information output device 12 inputs (transmits) position information acquired by measuring the position at which the position information output device 12 is installed (the position corresponds to a position of equipment in which the position information output device 12 is installed) based on the position information signals included in the radio waves emitted from the position information reference system 50 into the position information authoring apparatus 20. In the position information authoring system 1 shown in FIG. 1, the position information output device 12 transmits, by wireless communication, the position information to the wireless communication access point 32 included in the position information relay device 30. Therefore, the position information (the position of the equipment in which the position information output device 12 is installed) output from the position information output device 12 is output (transferred) to the position information authoring apparatus 20 via the wireless access point 32 and the backbone network 40. The position information output device 12 may have no measuring function and input (transmit) previously set position information representing own position to the position the information authoring apparatus 20.

The mobile terminal device 13 is carried by a worker that performs various works, for example, an inspection work for equipment in a plant, or a trouble handling work. The mobile terminal device 13 is a handheld terminal device such as a personal computer (PC) and a so-called tablet terminal, which has a function of a Personal Digital Assistant (PDA). The mobile terminal device 13 may be a dedicated handheld terminal device for use in a plant. The mobile terminal device 13 displays confirmation items of equipment, work contents, or the like, to be performed in a work site by the worker, which is a user of the mobile terminal device 13. The worker works in accordance with the confirmation items of the equipment, the work contents, or the like, displayed on the mobile terminal device 13, and inputs the confirmation results or the work records into the mobile terminal device 13. The mobile terminal device 13 stores the inputted confirmation results or work records (hereinafter, referred to as "work results"). The work results input into the mobile terminal device 13 include, not only literal information representing the confirmation results or work records, but also, for example, image information (photograph) acquired by taking the equipment in the work site. In addition, the mobile terminal device 13 inputs (transmits) position information acquired by measuring the position at which the mobile terminal device 13 is installed (the position corresponds to a current position of the worker) based on the position information signals included in the radio waves emitted from the position information reference system 50 and the stored work results into the position information authoring apparatus 20. In the position information authoring system 1 shown in FIG. 1, the mobile terminal device 13 transmits, by wireless communication, the position information and the work results to the wireless communication access point 32 included in the position information relay device 30. Therefore, the position information (the current position of the worker) and the work results output from the mobile terminal device 13 are output (transferred) to the position information authoring apparatus 20 via the wireless access point 32 and the backbone network 40. The mobile terminal device 13 may have no measuring function, acquire the position information representing the position of the work site at the actual work site, and input (transmit) the acquired position information and the work results into the position the information authoring apparatus 20. The method in which the mobile terminal device 13 acquires the position information at the work site may include a method in which, for example, the worker inputs the identification number of the work site found in the work site into the mobile terminal device 13 or makes the mobile terminal device 13 read the identification number when the worker starts works in accordance with the confirmation items of the equipment, the work contents, or the like, displayed on the mobile terminal device 13 or the worker finishes the works. Alternatively, the method may include a method in which, for example, the mobile terminal device 13 communicates with a transmitter, which emits signals (radio waves) representing the position information of the work site and is installed in the work site, to acquire the position information of the work site.

The position information relay device 30 includes a group of relay devices inputs (transfers) the position information, which is associated with at least one of a plurality of position information devices 10 and is output (transmitted) from the associated position information device 10, into the position information authoring apparatus 20 connected to the backbone network 40. As described above, the position information relay device 30 includes a plurality of relay devices (in FIG. 1, the wireless communication access point 31 and the wireless communication access point 32). Hereinafter, it is referred to as "position information relay device 30" when the relay devices included in the position information relay device 30 are not distinguished. The position information relay device 30 receives radio waves including the position information transmitted from the associated position information device 10 by wireless communication. The position information relay device 30 inputs (transfers) the position information included in the received radio waves into the position information authoring apparatus 20 connected to the backbone network 40. The position information to be relayed by the position information relay device 30 includes identification information, measured results, work results, and the like output (transmitted) from the associated position information device 10.

The position information relay device 30 is not limited to the relay device that inputs (transfers) the position information included in the received radio waves into the position information authoring apparatus 20 as shown in FIG. 1. For example, the position information relay device 30 may include a relay device that transfers (transmits) the position information included in the received radio waves by wireless communication. In addition, for example, the position information relay device 30 may input (transfer) one position information into the position information authoring apparatus 20 via a plurality of relay devices.

The wireless communication access point 31 is a wireless relay device in conformance with an industrial wireless standard. The wireless communication access point 31 receives position information included in radio waves in wireless communication in conformance with an industrial wireless standard and inputs (transfers) the received position information into the position information authoring apparatus 20. In the position information authoring system 1 shown in FIG. 1, the wireless communication access point 31 transfers the position information transmitted from the measuring device 11 by wireless communication to the position information authoring apparatus 20 via the backbone network 40.

The wireless communication access point 32 is a wireless relay device in conformance with a Wi-Fi (registered trademark) wireless standard. The wireless communication access point 32 receives position information included in radio waves in wireless communication in conformance with a Wi-Fi (registered trademark) wireless standard and inputs (transfers) the received position information into the position information authoring apparatus 20. In the position information authoring system 1 shown in FIG. 1, the wireless communication access point 32 transfers the position information transmitted from the position information output device 12 and the mobile terminal device 13 by wireless communication to the position information authoring apparatus 20 via the backbone network 40.

The position information relay device 30 is not limited to the wireless relay device that receives, by wireless communication, the position information output (transmitted) from the associated device as shown in FIG. 1, and may be a wired relay device that acquires position information from the associated device via a wired network. The communication standard, which the position information relay device 30 is in conformance with, is not limited to the above-described industrial or Wi-Fi (registered trademark) wireless standard, and may be various communication standard or method, for example, an industrial wireless standard such as ISA100.11a, a wireless standard such as a sensor network system, a wireless and wired communication standard such as Wireless/Wired HART, and a field bus standard such as FOUNDATION (registered trademark) field bus, PROFIBUS (PROCESS FIELD BUS).

The position information authoring apparatus 20 is a management apparatus that associates a previously created tree-dimensional plant model with the position of each position information device 10 transferred from the position information relay device 30 and manages them. As described above, the position information authoring apparatus 20 includes the position information server apparatus 21 and the position information authoring client apparatus 22.

The position information server apparatus 21 collects and manages coordinates, which represent a virtual position in the three-dimensional plant model, latitude, longitude, and height, which represent an actual position (relative position) of each position information device 10, measured results of each equipment arranged in the plant, and the like. The position information server apparatus 21 includes, for example, a personal computer and a server device. The position information server apparatus 21 identifies a virtual position (coordinates) and an actual position (absolute position), and includes a position information database storing position information data in which the identified virtual position and actual position and various information at this position are associated with each other. In the position information authoring system 1, as described above, the management associated with the actual equipment arranged in the plant is performed using the virtual three-dimensional plant model. At this time, a manager that manages equipment arranged in the plant performs the operation or control for virtual equipment represented by the three-dimensional plant model using the position information authoring client apparatus 22. The information of the operation or control for the equipment performed by the position information authoring client apparatus 22, in other words, the contents of the management associated with the actual equipment arranged in the plant are reflected to the position information data stored in the position information database. The position information server apparatus 21 inputs the information of the operation or control reflected to the position information data, in other words, control data to realize the management performed, by the manager, for the virtual equipment represented in the three-dimensional plant model, and the like, into the associated actual equipment. In other words, the position information server apparatus 21 makes each equipment in the actual space perform the contents of the management performed, by the manager, for each equipment in the virtual space.

In the position information authoring system 1, as described above, the management for the actual equipment arranged in the plant is performed via the operation of the position information authoring client apparatus 22 for the three-dimensional plant model. The manager may confirm the position information data stored in the position information database included in the position information server apparatus 21 and directly change (update) the position information database to manage each equipment arranged in the plant. In this case, the position information server apparatus 21 inputs control data depending on the information of the operation or control changed (updated) by the manager into the associated actual equipment.

The position information authoring client apparatus 22 creates a three-dimensional plant model to be managed by the position information server apparatus 21. In other words, the position information authoring client apparatus 22 creates, in the virtual space, equipment to be managed in the actual space. The position information authoring client apparatus 22 includes, for example, a mobile communication terminal such as a personal computer or a tablet terminal, which is operated by a model creator in charge of the creation of the three-dimensional plant model in the plant. The model creator combines elements such as pre-defined figures and lines to create the three-dimensional model for schematically drawing, in three dimensions, the shape of each equipment arranged in the plant. The three-dimensional plant model includes, not only model data acquired by modeling the shape of each equipment arranged in the plant in three dimensions, but also, for example, models with regard to the texture depending on the uneven surface of each equipment, and models with regard to the surrounding scene of each equipment. The model creator disposes the created three-dimensional model data of each equipment in the virtual space, and creates the three-dimensional plant model virtually representing the arrangement of each equipment in the virtual space. In addition, the model creator adds a mark representing the position of the position information device 10 previously installed in the plant (specifically, the measuring device 11 or the position information output device 12 previously installed in each equipment in the plant) to the created three-dimensional plant model to obtain a final three-dimensional plant model.

As described above, the position information authoring system 1 can create the three-dimensional plant model using three-dimensional CAD drawings, three-dimensional measured results (spatial data), and the like, in the plant. Therefore, the model creator may add the mark representing the position of each position information device 10 to the three-dimensional plant model created using the three-dimensional CAD drawings, the three-dimensional measured results (spatial data), and the like, to obtain a final three-dimensional plant model.

In the position information authoring system 1, the model creator operates the position information authoring client apparatus 22 to create the three-dimensional plant model, and the position information authoring client apparatus 22 shares the three-dimensional plant model with the position information server apparatus 21. Thereby, in the position information authoring system 1, the position information server apparatus 21 can extract the coordinates of the position of each marked position information device 10 in the three-dimensional plant model, and identify the extracted coordinates (virtual position) and the absolute position (actual position) of the each position information device 10 actually arranged in the plant.

In addition, in the position information authoring system 1, as described above, the manager manages the actual equipment arranged in the plant by the operation of the position information authoring client apparatus 22 for the three-dimensional plant model. Therefore, the position information authoring client apparatus 22 is also a management device, which is operated by the manager for managing the actual equipment arranged in the plant. The manager performs the input of the operation or control to each virtual equipment included in the three-dimensional plant model created by the position information authoring client apparatus 22.

Though FIG. 1 shows the case in which the position information authoring apparatus 20 includes the position information server apparatus 21 and the position information authoring client apparatus 22, as described above, in the position information authoring system 1, the position information server apparatus 21 and the position information authoring client apparatus 22 cooperates with each other, the operation or control, which the manager performs with respect to each equipment in the virtual space, is performed with respect to each equipment in the actual space. Therefore, in the position information authoring system 1, as described above, the three-dimensional plant model is shared between the position information server apparatus 21 and the position information authoring client apparatus 22. Therefore, in the position information authoring system 1, the position information server apparatus 21 and the position information authoring client apparatus 22, which are included in the position information authoring apparatus 20, are not necessarily different from each other. In other words, the position information authoring apparatus 20 included in the position information authoring system 1 may execute the processing function of the position information server apparatus 21 and the processing function of the position information authoring client apparatus 22 by a single apparatus (for example, a personal computer or a tablet terminal).

Figure 2:
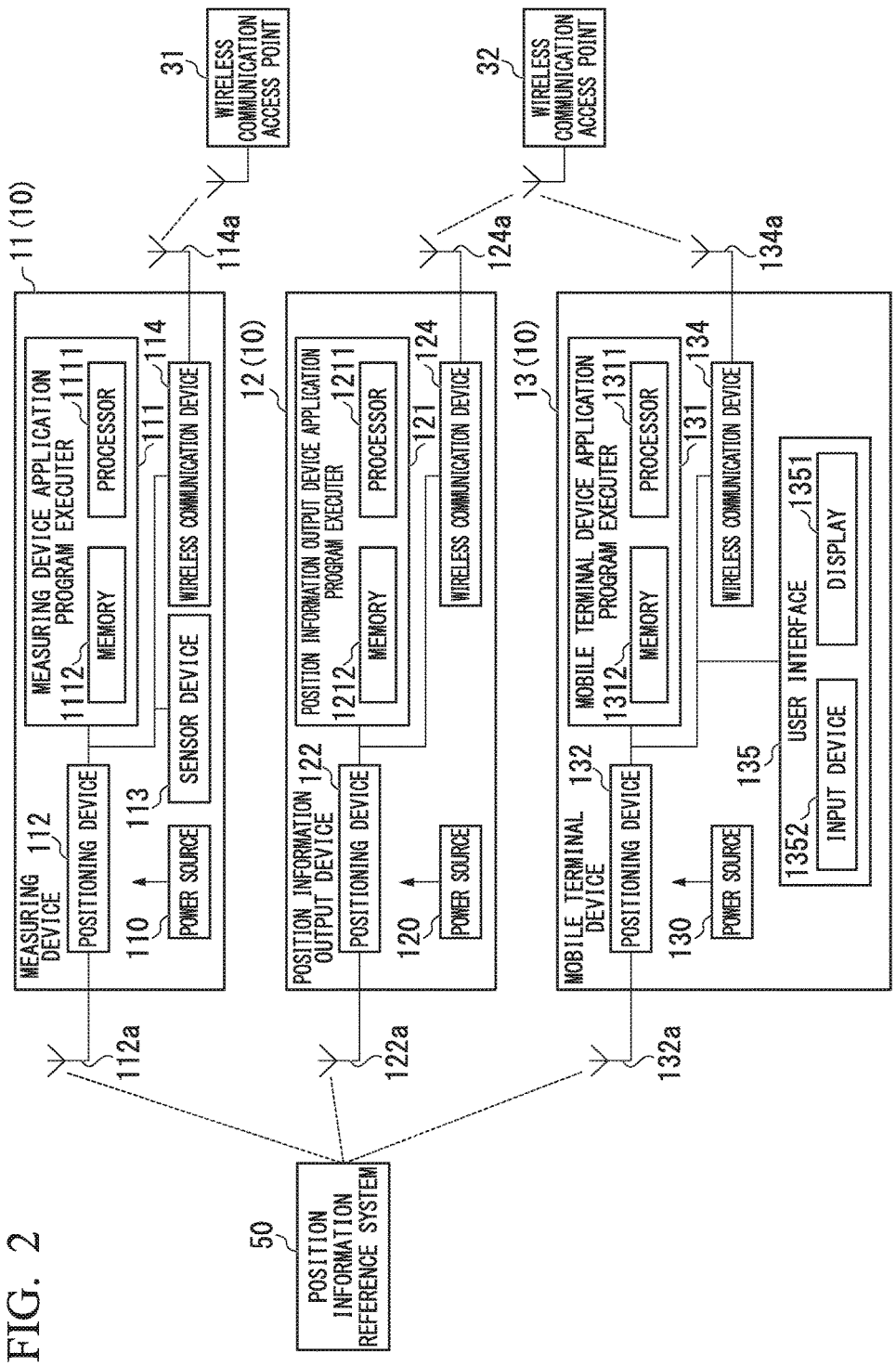
FIG. 2 is a block diagram schematically showing a position information device included in the position information authoring system according to the embodiment.

Next, an example of the more detailed constitution of the position information device 10 and the position information authoring apparatus 20 which are included in the position information authoring system 1 will be described. First, an example of the more detailed constitution of the position information device 10 will be described. FIG. 2 is a block diagram schematically showing the position information device 10 included in the position information authoring system 1 according to the embodiment. As described above, the position information device 10 includes various kinds of devices such as the measuring device 11, the position information output device 12, and the mobile terminal device 13. FIG. 2 shows an example of the more detailed constitution of each position information device 10. Also, FIG. 2 shows the position information reference system 50 and the position information relay device 30 (the wireless access point 31, the wireless access point 32), which communicates with each position information device 10.

First, an example of the more detailed constitution of the measuring device 11 which is one of the position information devices 10 will be described. The measuring device 11 includes a power source 110, a measuring device application program executer 111, a positioning device 112, a sensor device 113, a wireless communication device 114. The measuring device application program executer 111 includes a processor 1111 and a memory 1112.

The power source 110 is, for example, an AC power source or a battery, which supplies power required to operate each component included in the measuring device 11.

The positioning device 112 is connected to an antenna 112a, which is a satellite antenna such as a GPS antenna. The positioning device 112 calculates (measures) the position, at which the measuring device 11 is installed, based on position information signals included in GPS signals (radio waves) received by the antenna 112a, under the control of the control of the measuring device application program executer 111. The positioning device 112 inputs the position information of the measuring device 11, which is the measured result, into the measuring device application program executer 111.

The sensor device 113 is a measuring device which measures the status of the productive equipment in which the measuring device 11 is installed. The sensor device 113 measures the status of productive equipment such as "voltage", "temperature", "flow rate", "magnetism", and "pressure", under the control of the measuring device application program executer 111. The sensor device 113 inputs the results of the status of the measured productive equipment (measured results) into the measuring device application program executer 111.

The measuring device application program executer 111 is a controller which controls each component included in the measuring device 11. In the measuring device application program executer 111, the processor 1111 executes a measuring device application program for realizing the function of the measuring device 11 stored in the memory 1112. The measuring device application program includes processes for realizing the functions of the measuring device 11 such as a process for regularly measuring and collecting the state of the productive equipment using the sensor device 113, a process for making the measuring device 112 measure a position when the collected measured results are transmitted, and a process for transmitting the position information and the measured results to the wireless communication device 114. The processor 1111 controls each component included in the measuring device 11 depending on the executed measuring device application program. At this time, the processor 1111 uses the memory 1112 as a temporary storage which temporary stores data in the middle of executing the measuring device application program, for example, the position information input from the measuring device 112 and the measured results measured by the sensor device 113. The memory 1112 stores the measuring device application program to be executed by the processor 1111, the data in the middle of executing the measuring device application program, and the like. The memory 1112 includes, for example, various memories such as a Read Only Memory (ROM), a Random Access Memory (RAM), and a flash memory, and a storage device such as a Hard disk drive (HDD). The memory 1112 performs data storage (write) or data output (read) under the control of the processor 1111.

The wireless communication device 114 is a wireless communicator in conformance with an industrial wireless standard, and is connected to an antenna 114a, which is a wireless communication antenna. The wireless communication device 114 transmits, via the antenna 114a, the position information and the measured results, which are output from the measuring device 11 to the position information authoring apparatus 20 under the control of the measuring device application program executer 111 (in practice, the wireless communication device 114 transmits the position information and the measured results to the wireless communication access point 31 included in the position information relay device 30). Each data of the position information and the measured results output (transmitted) from the measuring device 11 to the position information authoring apparatus 20 may be collected and output from the measuring device application program executer 111, or the position information may be directly output from the measuring device 112 and the measured results may be directly output from the measuring device 112. The wireless communication device 114 converts and transmits each data of the input position information and measured results into data in a format to be transmitted to the wireless communication access point 31, in other words, data in a format in conformance with an industrial wireless standard.

The measuring device 11 having such a configuration transmits the position information representing the position of the installed productive equipment (including the identification information) and the measured results representing the state of the productive equipment to the wireless communication access point 31. Thereby, the position information and the measured results, which are transmitted from the measuring device 11 to the wireless communication access point 31, are input (transferred) into the position information authoring apparatus 20 via the backbone network 40.

Next, an example of the more detailed constitution of the position information output device 12 which is one of the position information devices 10 will be described. The position information output device 12 includes a power source 120, a position information output device application program executer 121, a positioning device 122, and a wireless communication device 124. The position information output device application program executer 121 includes a processor 1211 and a memory 1212.

The power source 120 is, for example, an AC power source or a battery, which supplies power required to operate each component included in the position information output device 12.

The positioning device 122 is connected to an antenna 122a, which is a satellite antenna such as a GPS antenna. The positioning device 122 calculates (measures) the position, at which the position information output device 12 is installed, based on position information signals included in GPS signals (radio waves) received by the antenna 122a, under the control of the control of the position information output device application program executer 121. The positioning device 122 inputs the position information of the position information output device 12, which is the measured result, into the position information output device application program executer 121.

The position information output device application program executer 121 is a controller which controls each component included in the position information output device 12. In the position information output device application program executer 121, the processor 1211 executes a position information output device application program for realizing the function of the position information output device 12 stored in the memory 1212. The position information output device application program includes processes for realizing the functions of the position information output device 12 such as a process for making the measuring device 122 measure a position at which the position information output device 12 is installed, and a process for transmitting the position information to the wireless communication device 124. The processor 1211 controls each component included in the position information output device 12 depending on the executed position information output device application program. At this time, the processor 1211 uses the memory 1212 as a temporary storage which temporary stores data in the middle of executing the position information output device application program, for example, the position information input from the measuring device 122. The memory 1212 stores the position information output device application program to be executed by the processor 1211, the data in the middle of executing the position information output device application program, and the like. The memory 1212 includes, for example, various memories such as a ROM, a RAM, and a flash memory, and a storage device such as an HDD. The memory 1212 performs data storage (write) or data output (read) under the control of the processor 1211.

The wireless communication device 124 is a wireless communicator in conformance with a Wi-Fi (registered trademark) wireless standard, and is connected to an antenna 124a, which is a wireless communication antenna. The wireless communication device 124 transmits, via the antenna 124a, the position information, which is output from the position information output device 12 to the position information authoring apparatus 20, under the control of the position information output device application program executer 121 (in practice, the wireless communication device 124 transmits the position information to the wireless communication access point 32 included in the position information relay device 30). The data of the position information output (transmitted) from the position information output device 12 to the position information authoring apparatus 20 may be output from the position information output device application program executer 121 or directly output from the measuring device 122. The wireless communication device 124 converts and transmits the input data of the position information into data in a format to be transmitted to the wireless communication access point 32, in other words, data in a format in conformance with a Wi-Fi (registered trademark) wireless standard.

The position information output device 12 having such a configuration transmits the position information representing the position of the installed productive equipment (including the identification information) to the wireless communication access point 32. Thereby, the position information transmitted from the position information output device 12 to the wireless communication access point 32 is input (transferred) into the position information authoring apparatus 20 via the backbone network 40.

Next, an example of the more detailed constitution of the mobile terminal device 13 which is one of the position information devices 10 will be described. The mobile terminal device 13 includes a power source 130, a mobile terminal device application program executer 131, a positioning device 132, a wireless communication device 134, and a user interface 135. The mobile terminal device application program executer 131 includes a processor 1311 and a memory 1312. The user interface 135 includes a display 1351 and an input device 1352.

The power source 130 is, for example, an AC power source or a battery, which supplies power required to operate each component included in the mobile terminal device 13.

The positioning device 132 is connected to an antenna 132a, which is a satellite antenna such as a GPS antenna. The positioning device 132 calculates (measures) the current position of the mobile terminal device 13 based on position information signals included in GPS signals (radio waves) received by the antenna 132a, under the control of the control of the mobile terminal device application program executer 131. The positioning device 132 inputs the current position information of the mobile terminal device 13, which is the measured result, into the mobile terminal device application program executer 131.

The user interface 135 is an information input and output that presents confirmation items or work contents of equipment to a worker who carries the mobile terminal device 13 and receives confirmation results or work records with respect to equipment, in other words, work results by the operations of the worker. In the user interface 135, the display 1351 presents the confirmation items or work contents of the equipment to the worker, and the input device 1352 receives the input operations of the confirmation results or work records with respect to equipment by the worker, in other words, the input operations of the work results. The display 1351 is a display device, for example, a Liquid Crystal Display (LCD), and displays images representing the confirmation items or work contents of the equipment output from the mobile terminal device application program executer 131 to present the information to the worker. The input device 1352 is an operation device including, for example, bottoms and switches, which receive the operations of the worker with respect to the mobile terminal device 13. The input device 1352 may include, for example, a mouse, a keyboard, and a pen type stylus (pointing device). The input device 1352 inputs the information depending on the received operations of the worker, in other words, the work results input by the worker into the mobile terminal device application program executer 131. The input device 1352 is not limited to the constitution including the bottoms or switches, and, for example, may be a constitution including a press sensor equipped with the display 1351. In other words, the user interface 135 may be a touch panel combining the display 1351 and the input device 1352. In this case, in the user interface 135, the display 1351 displays the images representing the confirmation items or work contents of the equipment to present the information to the worker, the input device 1352 detects various touch operations (tap, flick, or the like) performed by the worker with respect to the images displayed on the display 1351, and the input of the work results is received. The user interface 135 inputs the work results input by the worker into the mobile terminal device application program executer 131.

The mobile terminal device application program executer 131 is a controller which controls each component included in the mobile terminal device 13. In the mobile terminal device application program executer 131, the processor 1311 executes a mobile terminal device application program for realizing the functions of the mobile terminal device 13 stored in the memory 1312. The mobile terminal device application program includes processes for realizing the functions of the mobile terminal device 13 such as a process for making the measuring device 132 measure the current position of the mobile terminal device 13, a process for making the user interface 135 display the images representing the confirmation items or work contents of the equipment, a process for storing the work results input from the user interface 135, and a process for transmitting the position information and the work results to the wireless communication device 134. The processor 1311 controls each component included in the mobile terminal device 13 depending on the executed mobile terminal device application program. At this time, the processor 1311 uses the memory 1312 as a temporary storage which temporary stores data in the middle of executing the mobile terminal device application program, for example, the position information input from the measuring device 132 or the work results input from the user interface 135. The memory 1312 stores the mobile terminal device application program to be executed by the processor 1311, the data in the middle of executing the mobile terminal device application program, and the like. The memory 1312 includes, for example, various memories such as a ROM, a RAM, and a flash memory, and a storage device such as an HDD. The memory 1312 performs data storage (write) or data output (read) under the control of the processor 1311.

The wireless communication device 134 is a wireless communicator in conformance with a Wi-Fi (registered trademark) wireless standard, and is connected to an antenna 134a, which is a wireless communication antenna. The wireless communication device 134 transmits, via the antenna 134a, the position information and the work results, which are output from the mobile terminal device 13 to the position information authoring apparatus 20, under the control of the mobile terminal device application program executer 131 (in practice, the wireless communication device 134 transmits the position information and the work results to the wireless communication access point 32 included in the position information relay device 30). Each data of the position information and the work results output (transmitted) from the mobile terminal device 13 to the position information authoring apparatus 20 may be collected and output from the mobile terminal device application program executer 131, or the position information may be directly output from the measuring device 132 and the work results may be may be directly output from the user interface 135. The wireless communication device 134 converts and transmits each data of the input position information and work results into data in a format to be transmitted to the wireless communication access point 31, in other words, data in a format in conformance with a Wi-Fi (registered trademark) wireless standard.

The mobile terminal device 13 having such a configuration transmits the position information representing the current position of the mobile terminal device 13, in other words, the current position of the worker (including the identification information), and the work results representing the confirmation results or work records of the equipment input by the worker, to the wireless communication access point 32. Thereby, the position information and the work results transmitted from the mobile terminal device 13 to the wireless communication access point 32 is input (transferred) into the position information authoring apparatus 20 via the backbone network 40.

Figure 3:
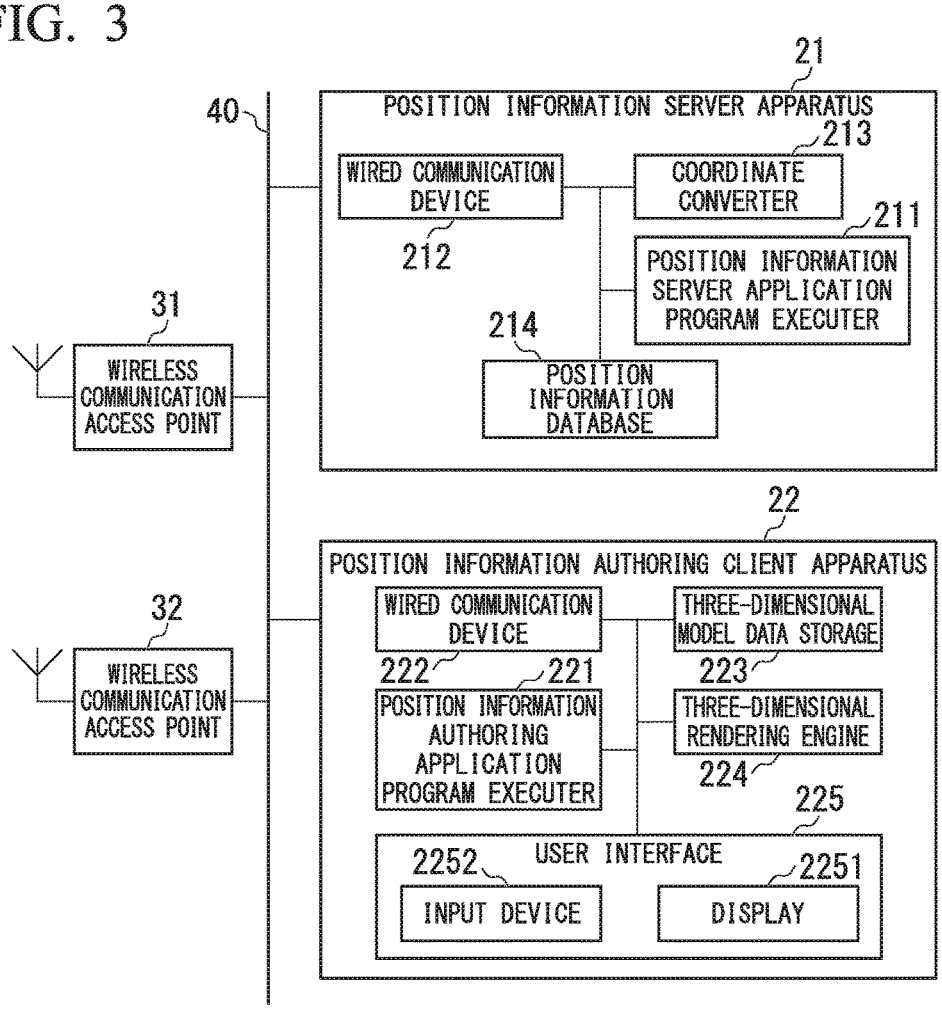
FIG. 3 is a block diagram schematically showing a position information authoring apparatus included in the position information authoring system according to the embodiment.

Next, an example of the more detailed constitution of the position information authoring apparatus 20 will be described. FIG. 3 is a block diagram schematically showing the position information authoring apparatus 20 included in the position information authoring system 1 according to the embodiment. As described above, the position information authoring apparatus 20 includes the position information server apparatus 21 and the position information authoring client apparatus 22. FIG. 3 shows an example of the more detailed constitution of each of the position information server apparatus 21 and the position information authoring client apparatus 22 included in the position information authoring apparatus 20. Also, FIG. 3 shows the position information relay device 30 (the wireless communication access point 31, the wireless communication access point 32) and the backbone network 40, which communicate with the position information server apparatus 21 and the position information authoring client apparatus 22 included in the position information authoring apparatus 20.

First, an example of the more detailed constitution of the position information server apparatus 21 included in the position information authoring apparatus 20 will be described. The position information server apparatus 21 includes a position information server application program executer 211, a wired communication device 212, a coordinate converter 213, and a position information database 214.

The wired communication device 212 is a wired communicator in conformance with a communication standard such as a wired LAN, and receives position information transferred from the position information relay device 30 via the backbone network 40 under the control of the position information server application program executer 211. The wired communication device 212 inputs the received position information into the coordinate converter 213. In addition, the wired communication device 212 transmits information to be transmitted to the associated position information device 10 to the position information relay device 30 via the backbone network 40 under the control of the position information server application program executer 211. Thereby, the information output from the position information server apparatus 21 is transferred to the position information device 10 via the wireless communication access point 31 or the wireless communication access point 32. In addition, the wired communication device 212 transmits information of operations or control incorporated into the position information data, in other words, control data for managing actual equipment arranged in the plant, and the like, to each type of actual equipment, which is a management target, via the backbone network 40 under the control of the position information server application program executer 211. The control data relates to the control which the manager performs with respect to the virtual equipment represented in the three-dimensional plant model by operating the position information authoring client apparatus 22. Thereby, each equipment arranged in the plant operates in accordance with the control data transmitted from the position information server apparatus 21.

The coordinate converter 213 mutually converts actual position (absolute position) of the position information device 10 and virtual position (coordinates) in the three-dimensional plant model under the control of the position information server application program executer 211. Specifically, the coordinate converter 213 converts position information input from the wired communication device 212, in other words, a position (latitude, longitude, height) in the actual space in which the position information device 10 exists, into a position (x, y, z) in the virtual space in which the position information device 10 exists in the three-dimensional plant model. In addition, the coordinate converter 213 converts position of the position information device 10 marked by the model creator, in other words, position (x, y, z) in the virtual space in which the position information device 10 exists in the three-dimensional plant model, into position (latitude, longitude, height) in the actual space in which the position information device 10 exists. Thereby, the actual position of the position information device 10 in the actual space and the virtual position of the position information device 10 in the virtual space (the position marked by the model creator in the three-dimensional plant model) are identified. The coordinate converter 213 associates the identified actual position (hereinafter, referred to as "actual position") with the virtual position (hereinafter, referred to as "virtual position") and stores them into the position information database 214. When the coordinate converter 213 stores the position information in which the actual position and the virtual position are associated with each other into the position information database 214, the coordinate converter 213 also associates identification information included in the position information input from the wired communication device 212 and the information such as measured results and work results, with the position information, and stores them into the position information database 214. There are various methods for identifying position (latitude, longitude, height) in the actual space and position (x, y, z) in the virtual space by the coordinate converter 213. The coordinate converter 213 may identify position (latitude, longitude, height) in the actual space and position (x, y, z) in the virtual space using the related art.

The position information database 214 stores the position information data. The position information database 214 stores, as one position information data, the actual position of the position information device 10 identified by the coordinate converter 213, the information such as identification information, measured results, and work results, and the virtual position of the marked position information device 10 in the three-dimensional plant model.

The position information server application program executer 211 is a controller which controls each component included in the position information server apparatus 21. In the position information server application program executer 211, a processor (not shown) executes a position information server application program for realizing the functions of the position information server apparatus 21 stored in a memory (not shown). The position information server application program includes processes for realizing the functions of the position information server apparatus 21 such as a process for transmitting and receiving position information by the wired communication device 212, and a process for identifying an actual position in an actual space and a virtual position in a virtual space. In addition, the position information server application program includes a process for mutually correcting the position in the actual space in which the position information device exists and the position in the virtual space in which the position information device exists in the three-dimensional plant model, and the like. The position information server application program executer 211 controls each component included in the position information server apparatus 21 depending on the executed position information server application program. The application method of the memory (not shown) by the processor (not shown), and the constitution and operations of the memory are similar to those of the application program executer included in the position information device 10, in other words, the measuring device application program executer 111, the position information output device application program executer 121, and the mobile terminal device application program executer 131 shown in FIG. 2, and the like.

The position information server apparatus 21 having such a constitution identifies the position of the position information device 10 in the actual space and the position of the position information device 10 in the virtual space. In addition, the position information server apparatus 21 reflects the management performed by the manager with respect to the equipment in the actual space to the associated position information data stored in the position information database 214, and transmits the reflected control data and the like to each equipment in the actual space to make each equipment perform a process in accordance with the control data.

Figure 4A:
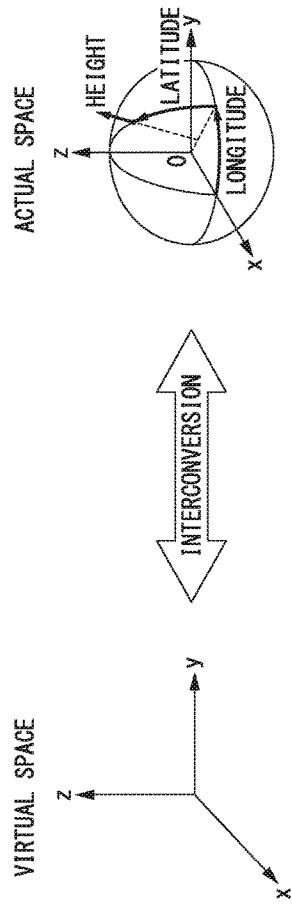
FIG. 4A is a diagram schematically showing a position conversion process by the position information authoring apparatus included in the position information authoring system according to the embodiment.
Figure 4B:
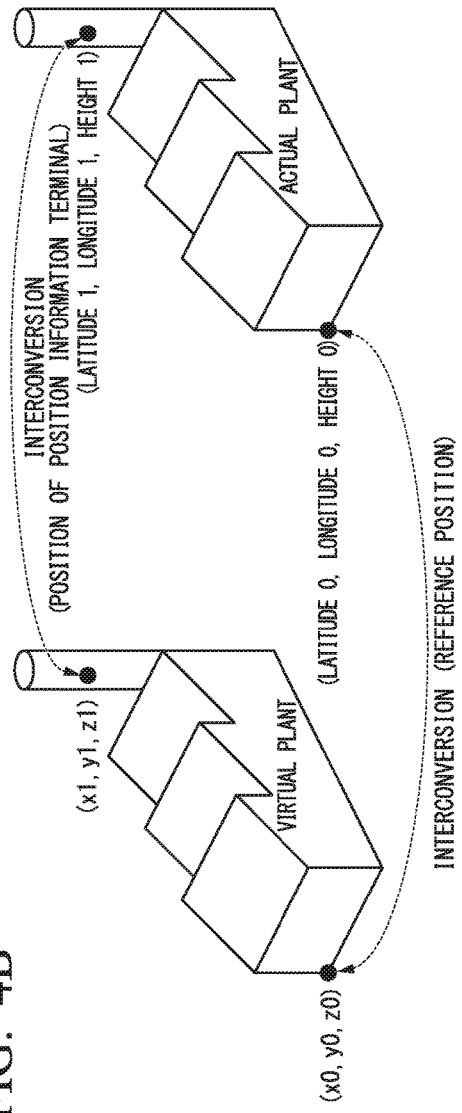
FIG. 4B is a diagram schematically showing a position conversion process by the position information authoring apparatus included in the position information authoring system according to the embodiment.

The summary of the operations of the position information server apparatus 21 will be described. First, the mutual conversion operation between a position (latitude, longitude, height) in the actual space and a position (x, y, z) in the virtual space by the coordinate converter 213 will be described. Each of FIGS. 4A and 4B is a diagram schematically showing a position conversion process by the position information authoring apparatus 20 included in the position information authoring system 1 according to the present embodiment. FIGS. 4A and 4B schematically shows a mutual conversion process between a position (x, y, z) in the virtual space by the coordinate converter 213 of the position information server apparatus 21 included in the position information authoring apparatus 20 and a position (latitude, longitude, height) in the actual space.

As described above, the coordinate converter 213 mutually converts a position (latitude, longitude, height) in the actual space and a coordinate (x, y, z) of a position in the virtual space (refer to FIG. 4A). For example, as shown in FIG. 4B, a position (x, y, z) of a virtual plant arranged in the virtual space by the three-dimensional (3D) plant model and a position (latitude, longitude, height) of an actual plant actually arranged in the plant are mutually converted. Thereby, the virtual position of the position information device 10 or the virtual plant in the virtual space and the actual position of the position information device 10 or the actual plant in the actual space are identified.

FIG. 4B shows the state in which a coordinate (x0, y0, z0) of a virtual position set as a reference (origin) in the virtual plant and an absolute position (latitude 0, longitude 0, height 0) of an actual position set as a reference (origin) in the actual plant are identified. In addition, FIG. 4B shows the state in which a coordinate (x1, y1, z1) of a virtual position of the position information device 10 installed in the virtual plant (for example, the measuring device 11 marked by the model creator in the three-dimensional plant model) and an absolute coordinate (latitude 1, longitude 1, height 1) of an actual position of the position information device 10 actually installed in the actual plant (for example, the measuring device 11 for measuring "temperature") are identified. The coordinate converter 213 associates the identified virtual position=(x0, y0, z0) with the actual position (latitude 0, longitude 0, height 0) and stores them into the position information database 214. In addition, the coordinate converter 213 associates the identified virtual position=(x1, y1, z1) with the actual position (latitude 1, longitude 1, height 1) and stores them into the position information database 214.

Figure 5:
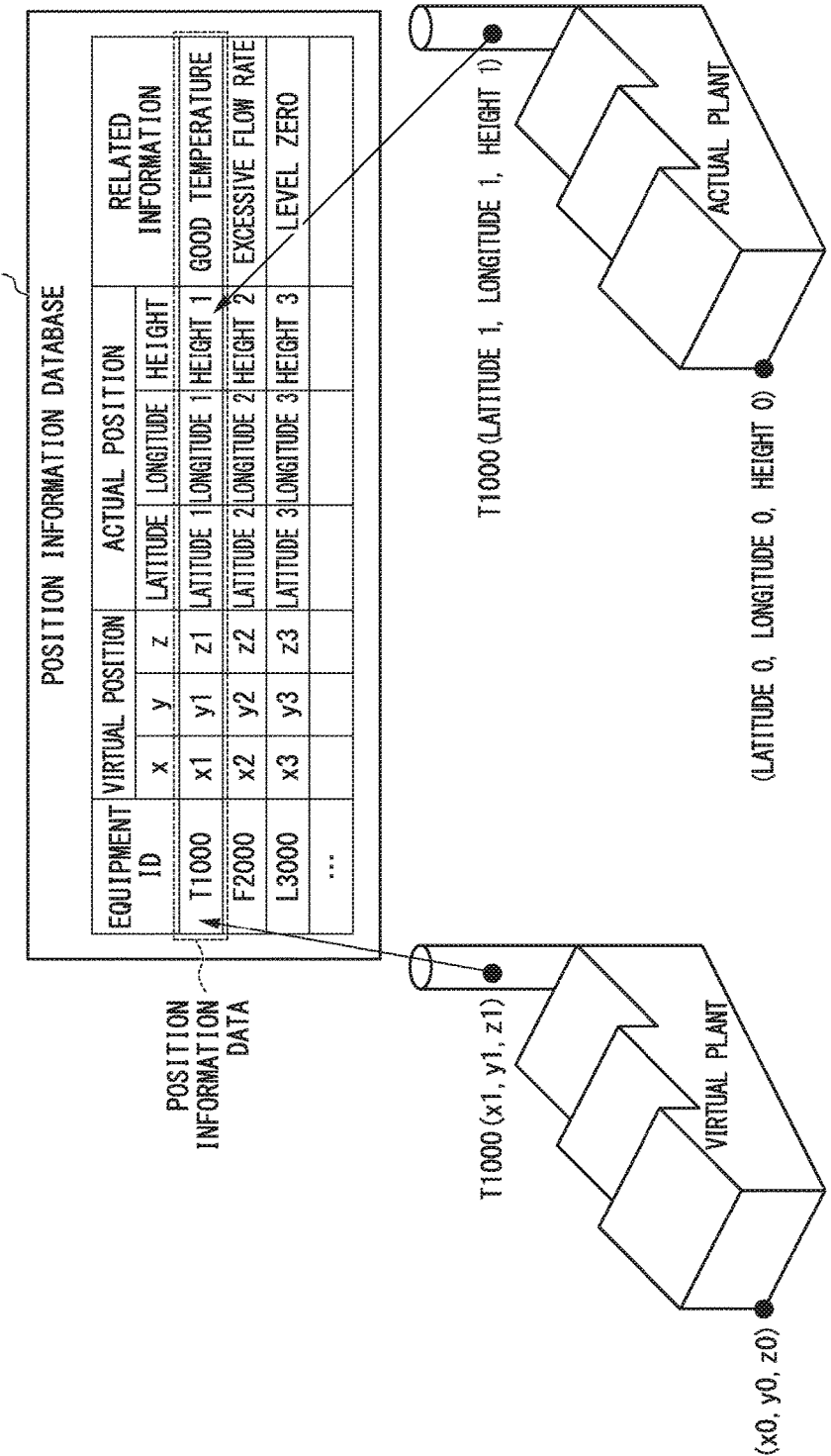
FIG. 5 is a diagram schematically showing a position information database in the position information authoring apparatus included in the position information authoring system according to the embodiment.

Next, the summary of the position information data stored in the position information database 214 will be described. FIG. 5 is a diagram schematically showing the position information database 214 in the position information authoring apparatus 20 included in the position information authoring system 1 according to the embodiment. FIG. 5 shows an example of the position information database 214 storing one position information data including identification information, virtual information, actual information, and related information for each position information device 10 identified by the coordinate converter 213.

As described above, in each position information stored in the position information database 214 in the position information server apparatus 21, the position information of the position information device 10 in which the actual position and the virtual position are associated with each other, the identification information, the measured results, the work results, and the like are associated with each other. FIG. 5 shows an example of the position information database 214 storing, for each position information device 10 installed in the plant, the exclusively assigned identification information (equipment ID), the virtual position (x, y, z) and the actual position (latitude, longitude, height) identified by the coordinate converter 213, and the information related to the position information device 10, which are associated with each other. The position information data in the first row of the position information database 214 shown in FIG. 5 is an example of position information data associated with the position information device 10, which is the measuring device 11 for measuring "temperature" shown in FIGS. 4A and 4B and the equipment ID "T1000" is assigned to. Specifically, the position information data associated with the position information device 10, to which the equipment ID "T1000" is assigned, includes information, which indicates that the position at which the position information device 10 is installed is represented by the above-stated virtual position (x1, y1, z1) and the actual position (latitude 1, longitude 1, height 1), and related information, which indicates that the measured temperature is normal (good temperature). Similarly, the position information database 214 stores, as position information data associated with another position information device 10, equipment ID, a virtual position, an actual position, and related information, which are associated with each other.

As described above, the manager directly changes (updates) the position information data while confirming the position information data stored in the position information database 214, in other words, confirming the related information associated with each position information device 10, and thereby can operate or control the equipment in the actual space.

Next, an example of the more detailed constitution of the position information authoring client apparatus 22 included in the position information authoring apparatus 20 will be described. The position information authoring client apparatus 22 includes a position information authoring application program executer 221, a wired communication device 222, a three-dimensional model data storage 223, a three-dimensional rendering engine 224, and a user interface 225. In addition, the user interface 225 includes a display 2251 and an input device 2252.

The wired communication device 212 is a wired communicator in conformance with a communication standard such as a wired LAN, and receives position information transferred from the position information relay device 30 via the backbone network 40 under the control of the position information authoring application program executer 221. The wired communication device 222 inputs the received position information into the three-dimensional rendering engine 224. In addition, the wired communication device 222 transmits control data to the position information server apparatus 30 via the backbone network 40 under the control of the position information authoring application program executer 221. The control data relates to the control which the manager performs for the virtual equipment represented in the three-dimensional plant model by operating the position information authoring client apparatus 22. The control data is for controlling the actual equipment arranged in the plant, in other words, operation information or control information to be reflected to the position information data. Thereby, the position information data stored in the position information database 214 included in the position information server apparatus 21 is changed (updated). The control data in the changed (updated) position information data is transmitted from the position information server apparatus 21 to each equipment arranged in the plant, and each equipment operates depending on the control data transmitted from the position information server apparatus 21.

The wired communication device 222 transmits the three-dimensional plant model stored in the three-dimensional model data storage 223 to the mobile terminal device 13, which is one of the position information terminals 10, depending on the control of the position information authoring application program executer 221. In other words, the wired communication device 222 transmits the three-dimensional plant model to the wireless communication access point 32 included in the position information relay device 30 via the backbone network 40. Thereby, the three-dimensional plant model output from the position information authoring client apparatus 22 is transferred to the mobile terminal device 13 via the wireless communication access point 32. In the mobile terminal device 13, the mobile terminal device application program executer 131 performs, for example, an Augmented Reality (AR) drawing function included in the mobile terminal device application program, and thereby displays, on the display 1351 in the user interface 135, an image in which the virtual space represented by the actual space is overlapped with the three-dimensional plant model. Thereby, the position of each equipment or each position information device 10 in the virtual space can be visually provided to a worker who carries the mobile terminal device 13.

The three-dimensional model data storage 223 stores the three-dimensional plant model created by the model creator, each three-dimensional model data for creating the three-dimensional plant model, and the like. The three-dimensional model data storage 223 inputs the stored three-dimensional plant model or three-dimensional model data into the three-dimensional rendering engine 224 depending on the control of the position information authoring application program executer 221. The three-dimensional model data storage 223 may store original data for creating the three-dimensional plant model such as three-dimensional CAD drawings and three-dimensional measured results (special data).

The three-dimensional rendering engine 224 is an image processor for three-dimensionally rendering an image of the three-dimensional plant model or the three-dimensional model data. The three-dimensional rendering engine 224 displays, on the display 2251 in the user interface 225, an image depending on the three-dimensional plant model or the three-dimensional model data output from the three-dimensional model data storage 223 depending on the control of the position information authoring application program executer 221. There are various image processing methods for three-dimensionally rendering an image depending on the three-dimensional plant model or the three-dimensional model data by the three-dimensional rendering engine 224. The three-dimensional rendering engine 224 may perform an image processing of three-dimensional images using the related art.

The user interface 225 is an information input and output for providing work circumstances or various data to the model creator who creates the three-dimensional plant model or the three-dimensional model data using the position information authoring client apparatus 22, and for receiving operations of the model creator. In the user interface 225, the displays 2251 provides work circumstances or various data for creating the three-dimensional plant model or the three-dimensional model data to the model creator, and the input device 2252 receives input operations of the model creator when the model creator creates the three-dimensional plant model or the three-dimensional model data. If the position information authoring client apparatus 22 includes a personal computer, the display 2251 is a display device such as a liquid crystal display. The displays 2251 displays an image based on the three-dimensional plant model or the three-dimensional model data, which are output from the three-dimensional rendering engine 224 depending on the control of the position information authoring application program executer 221 to provide work circumstances or various data to the model creator. In addition, if the position information authoring client apparatus 22 includes a personal computer, the input device 2252 is an operation device for receiving operations of the model creator with respect to work circumstances or various data, such as a mouse and a keyboard. The input device 2252 inputs the information of the received operations of the model creator, in other words, the operations for creating the three-dimensional plant model or the three-dimensional model data input by the model creator, into the position information authoring application program executer 221.

The user interface 225 is an information input and output for providing the three-dimensional plant model to the manager who manages the operation state or maintenance state of each equipment actually arranged in the plant using the position information authoring client apparatus 22, and for receiving operations of the manager. In the user interface 225, the display 2251 provides the three-dimensional plant model to the manager, and the input device 2252 receives the input operations for the three-dimensional plant model performed by the manager. The display 2251 displays an image based on the three-dimensional plant model depending on the control of the position information authoring application program executer 221 to provide the management environments of the virtual equipment represented by the three-dimensional plant model. In addition, the input device 2252 receives the operations or control of the manager for the virtual equipment represented by the three-dimensional plant model, and inputs information depending on the received manager's operations, in other words, information for changing (updating) the position information data stored in the position information database 214 included in the position information server apparatus 21 into the position information authoring application program executer 221. Thereby, the wired communication device 222 transmits information for changing (updating) the position information data to the position information server apparatus 21 depending on the control of the position information authoring application program executer 221, the position information server apparatus 21 transmits control data included in the changed (updated) position information data to each equipment arranged in the plant, and each equipment operates depending on the changed (updated) control data.

The position information authoring client apparatus 22 includes a mobile communication terminal such as a tablet terminal, the user interface 225 may be a touch panel including a combination of the display 2251 and the input device 2252. In this case, the input device 2252 may be, for example, a pen type stylus (pointing device). The user interface 225 detects, by the input device 2252, information depending on various touch operations (tap, flick, or the like) performed by the model creator or the manager with respect to the image based on the three-dimensional plant model represented by the display 2251, and inputs the detected information depending on the operation of the model creator or the manager into the position information authoring application program executer 221.

The position information authoring application program executer 221 is a controller which controls each component included in the position information authoring client apparatus 22. In the position information authoring application program executer 221, a processor (not shown) executes a position information authoring application program for realizing the functions of the position information authoring client apparatus 22 stored in a memory (not shown). The position information authoring application program includes processes for realizing the functions of the position information authoring client apparatus 22 such as an image process of three-dimensional rendering by the three-dimensional rendering engine 224, and a process for receiving operations with respect to the three-dimensional plant model. The position information authoring application program executer 221 controls each component included in the position information authoring client apparatus 22 depending on the executed position information authoring application program. The application method of the memory (not shown) by the processor (not shown), and the constitution and operations of the memory are similar to those of the application program executer included in the position information device 10 (refer to FIG. 2), those of the position information authoring application program executer 211 included in the position information server apparatus 21, or the like.

The position information authoring client apparatus 22 having such a constitution creates and stores the three-dimensional model data or three-dimensional plant model for three-dimensionally representing, in the virtual space, the equipment or the position information device 10 in the actual space managed by the position information server apparatus 21 depending on the operations of the model creator. In addition, the position information authoring client apparatus 22 transmits the information depending on the operations of the manager for the equipment represented by the three-dimensional plant model to the position information server apparatus 21. In addition, the position information authoring client apparatus 22 transmits the three-dimensional plant model to the mobile terminal device 13, which is one of the position information devices 10, to provide, as three-dimensional information, the information of each equipment arranged in the plant to the worker who carries the mobile terminal device 13.

Figure 6:
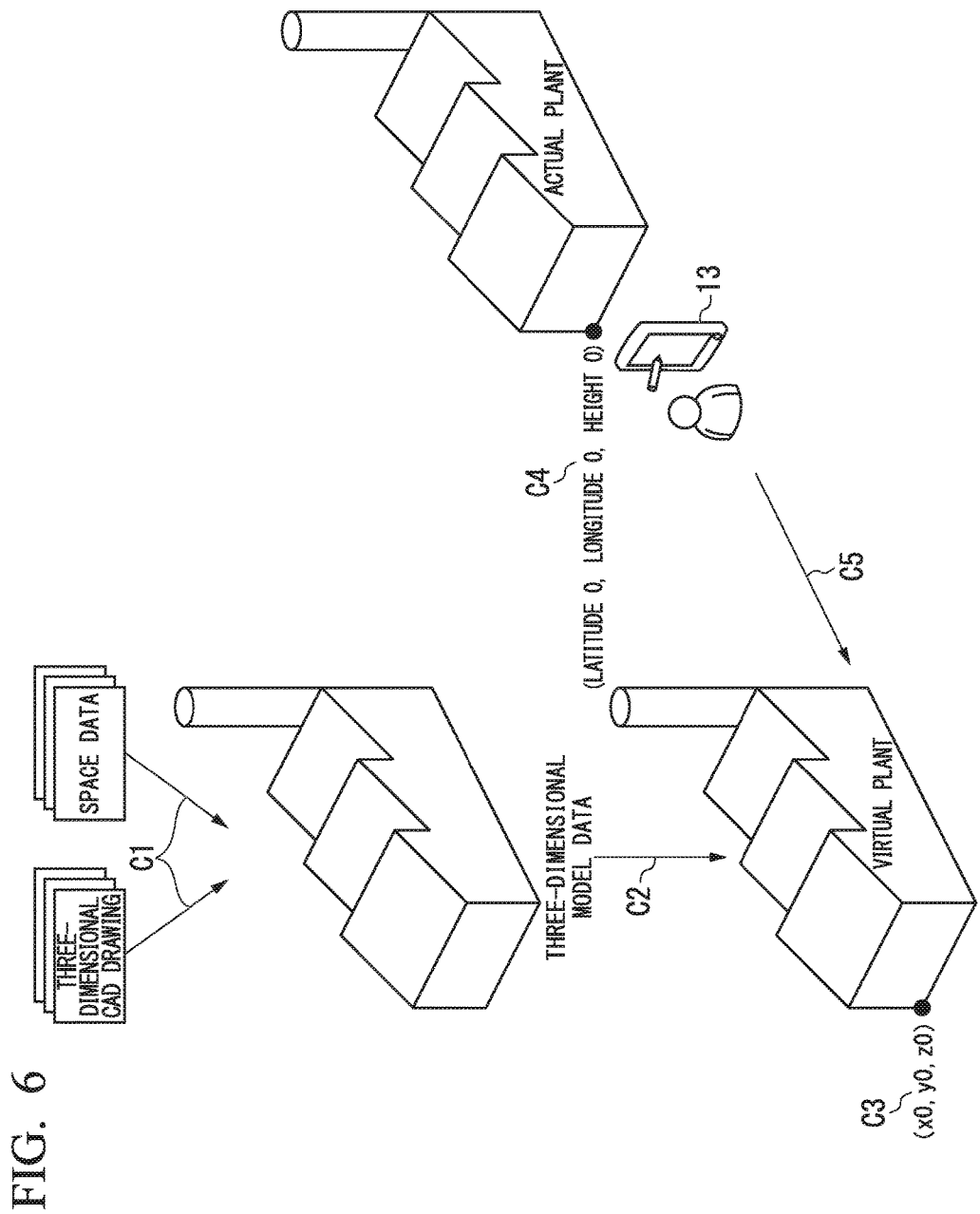
FIG. 6 is a diagram schematically showing a procedure in which the position information authoring apparatus included in the position information authoring system according to the embodiment creates a three-dimensional model.

A method for creating the three-dimensional plant model by the position information authoring client apparatus 22 will be described. FIG. 6 is a diagram schematically showing a procedure in which the position information authoring apparatus 20 included in the position information authoring system 1 according to the embodiment creates the three-dimensional model. FIG. 6 shows a procedure in which the model creator creates the three-dimensional model using the position information authoring client apparatus 22. The three-dimensional model is created in accordance with the following procedures.

(Procedure C1)

The model creator creates the three-dimensional model data of each equipment arranged in the plant using three-dimensional CAD drawings at the time of plant design or construction, three-dimensional measured results (special data) measured by a three-dimensional laser scanner, and the like, in combination. The model creator may create the three-dimensional model data using, for example, an application program for creating a three-dimensional model to be executed by the position information authoring application program executer 221. The position information authoring client apparatus 22 stores the three-dimensional model data of each equipment created by the model creator into the three-dimensional model data storage 223.

(Procedure C2)

The model creator disposes the three-dimensional model data of each equipment stored in the three-dimensional model data storage 223 to create the three-dimensional model. The model creator may create the three-dimensional model including the three-dimensional model data of each equipment disposed in the virtual space, using, for example, an application program for creating a three-dimensional model to be executed by the position information authoring application program executer 221.

(Procedure C3)

The model creator defines an origin coordinate (x0, y0, z0) at a reference (origin) position of the plant in the three-dimensional plant model stored in the three-dimensional model data storage 223. The model creator may mark at various points in the virtual space using, for example, an application program for creating the three-dimensional model used to create the three-dimensional plant model. The position information authoring client apparatus 22 stores the three-dimensional plant model created by the model creator and the origin coordinate (x0, y0, z0) defined by the model creator into the three-dimensional model data storage 223.

In accordance with such procedures, the model creator creates the three-dimensional plant model in which the three-dimensional model data of each equipment is arranged in the plant represented by the virtual space.

(Procedure C4)

Then, for example, the worker carrying the mobile terminal device 13 visits the reference (origin) position defined by the model creator, and measures an absolute position (latitude 0, longitude 0, height 0) at the actual position associated with the defined position. The mobile terminal device 13 transmits the measured position information (absolute positional information) to the position information authoring client apparatus 22.

(Procedure C5)

The model creator performs a setting for associating the origin coordinate (x0, y0, z0) defined in the three-dimensional plant model with the absolute position (latitude 0, longitude 0, height 0) transmitted from the mobile terminal device 13, which represents the same position as that represented by the origin coordinate. The position information authoring client apparatus 22 stores the three-dimensional plant model in which the reference (origin) position in the virtual space and the actual position are associated with each other, the origin coordinate (x0, y0, z0), and the absolute position (latitude 0, longitude 0, height 0) into the three-dimensional model data storage 223.

In accordance with such procedures, the model creator creates the three-dimensional plant model in which the reference (origin) position in the plant represented by the virtual space and the actual position in the actual plant are associated with each other. Subsequently, in the created three-dimensional plant model, the position of each equipment defined in the virtual space and the position of each equipment in the actual space are consistently associated with each other. For example, in the virtual space, the coordinate of each point can be represented based on the difference from the reference (origin) position, and the absolute position associated with the coordinate of each point can be calculated.

In the above-described creation procedures of three-dimensional plant model, the method has been described in which the worker carrying the mobile terminal device 13 visits the origin position and acquires the information of the absolute position at the actual position associated with the origin position. The method for acquiring the absolute position associated with the origin position is not limited to the above-described method. For example, the position of the predetermined measuring device 11 installed in equipment or the position information output device 12 may be defined as a reference (origin) position in the actual space, and the coordinate associated with the measuring device 11 or the position information output device 12 in the virtual space may be defined as a reference (origin) position in the virtual space.

In accordance with such procedures, the position information authoring system 1 provides the management circumstance for each equipment in the plant based on the created three-dimensional plant model. Thereby, in the plant employing the position information authoring system 1, the circumstances of the position information authoring system 1 can be used for supporting various works.

First Operation Example

Figure 7:
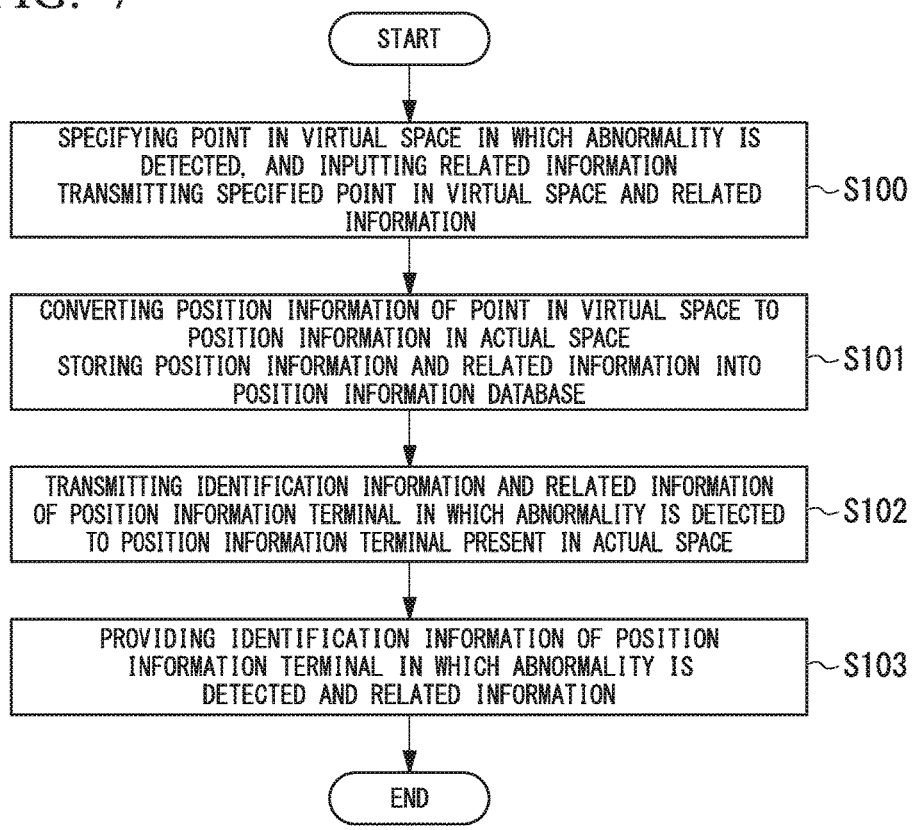
FIG. 7 is a flowchart showing a procedure of a first operation example in a plant using the position information authoring system according to the embodiment.
Figure 8:
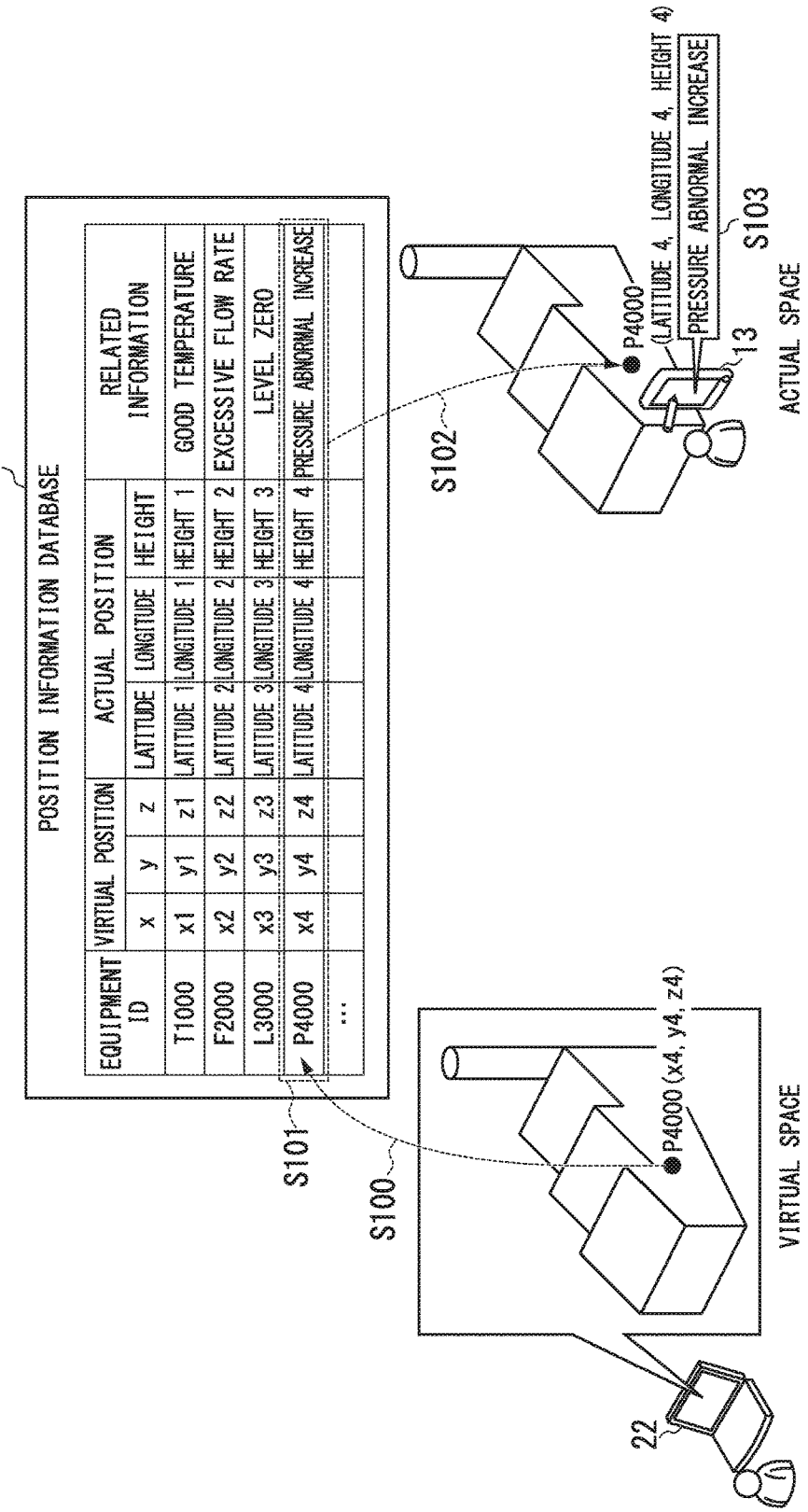
FIG. 8 is a diagram schematically showing operations of the first operation example in the plant using the position information authoring system according to the embodiment.

Next, an operation example in a plant using the position information authoring system 1 according to the present embodiment will be described. FIG. 7 is a flowchart showing a procedure of a first operation example in a plant using the position information authoring system 1 according to the present embodiment. FIG. 8 is a diagram schematically showing operations of the first operation example in the plant using the position information authoring system 1 according to the present embodiment. Hereinafter, the procedure of the first operation example shown in FIG. 7 will be described with reference to the operations of the first operation example shown in FIG. 8.

In the first operation example, abnormalities in productive equipment arranged in the plant are notified to a worker carrying the mobile terminal device 13 and moving in the plant. A description will be provided for the case in which a manager finds abnormalities in the related information of the specific measuring device 11 when the manager confirms each position information data stored in the position information database 214. In this case, the position information authoring system 1 performs a process in accordance with the following procedures. In the position information authoring system 1, the position information device 10 and the position information authoring apparatus 20 communicate with each other via the position information relay device 30. However, in order to simplify the description, hereinafter, a description will be provided for the case in which the position information device 10 and the position information authoring apparatus 20 directly communicate with each other.

(Step S100)

When a manager detect abnormalities in the related information of the specific measuring device 11, the manager specifies, using the input device 2252, the point in the virtual space associated with the abnormal measuring device 11 represented by the three-dimensional plant model, which is displayed on the display 2251 included in the position information authoring client apparatus 22. In the example shown in FIG. 8, the case in which the abnormality in the measuring device 11, to which an equipment ID "P4000" is assigned, is detected, and a virtual position (x4, y4, z4) is specified is shown. The manager inputs related information for the measuring device 11 arranged in the specified point of the virtual space (for example, comment text "Pressure Abnormal Increase"). Thereby, the position information authoring client apparatus 22 transmits the virtual position (x4, y4, z4) associated with the point specified by the manager and the input text data "Pressure Abnormal Increase" to the position information server apparatus 21 via the backbone network 40.

(Step S101)

The position information server apparatus 21 converts the point in the virtual space transmitted from the position information authoring client apparatus 22 into the position in the actual space. In the example shown in FIG. 8, the case in which the virtual position (x4, y4, z4) is converted into the actual position (latitude 4, longitude 4, height 4). The position information server apparatus 21 stores the information transmitted from the position information authoring client apparatus 22 as the related information of the position information data associated with the converted actual position (latitude 4, longitude 4, height 4). In other words, the position information data associated with the measuring device 11 in which the abnormality is detected is changed (updated). In the example shown in FIG. 8, the case in which the text data "Pressure Abnormal Increase" is stored as the related information associated with the portion information data of the measuring device 11, to which an equipment ID "P4000" associated with the actual position (latitude 4, longitude 4, height 4) is assigned is shown.

(Step S102)

The position information server apparatus 21 transmits the identification information and the related information of the measuring device 11 in which the position information data is changed (updated) to the mobile terminal device 13 in the actual space. Here, in the actual space, the position information server apparatus 21 transmits the identification information and the related information to the mobile terminal device 13 in the vicinity of the measuring device 11 in which the position information data is changed (updated) (for example, within 50 m radius). In the example shown in FIG. 8, the case in which the position information server apparatus 21 transmits the identification information identifying the measuring device 11 in which the position information data is changed (updated), i.e. the equipment ID "P4000", and the related information, i.e. the text data "Pressure Abnormal Increase" is shown.

(Step S103)

The mobile terminal device 13, which receives from the position information server apparatus 21 the identification information and the related information of the measuring device 11 in which the position information data is changed (updated), displays the received identification information and related information on the display 1351 to provide them to the worker carrying the mobile terminal device 13. Thereby, based on the provided information, the worker can visit the measuring device 11 in which the abnormality is detected, in other words, the measuring device 11 to which the equipment ID "P4000" is assigned, and perform appropriate works.

In accordance with such procedures, in the position information authoring system 1, the abnormalities in the productive equipment arranged in the plant detected by the manager can be notified to the worker carrying the mobile terminal device 13 and moving in the plant. Thereby, in the plant using the position information authoring system 1, detection works of equipment, maintenance works, and works for handling troubles can be promptly performed, and safety operations of each equipment can be continued.

In the first operation example, the position information server apparatus 21 may instruct the position information authoring client apparatus 22 to transmit the three-dimensional plant model when the position information data is changed (updated) in the step S202, in other words, the identification information and the related information of the measuring device 11 in which the abnormality is detected is transmitted. In this case, in the first operation example, when the mobile terminal device 13 displays on the display 1351 the identification information and the related information, which relate to the measuring device 11 in which the abnormality is detected and are transmitted from the position information server apparatus 21, the drawing of the augmented reality is performed based on the three-dimensional plant model transmitted from the position information authoring client apparatus 22, and thereby the position of the measuring device 11 in which the abnormality is detected can be visually provided.

Second Operation Example

Figure 9:
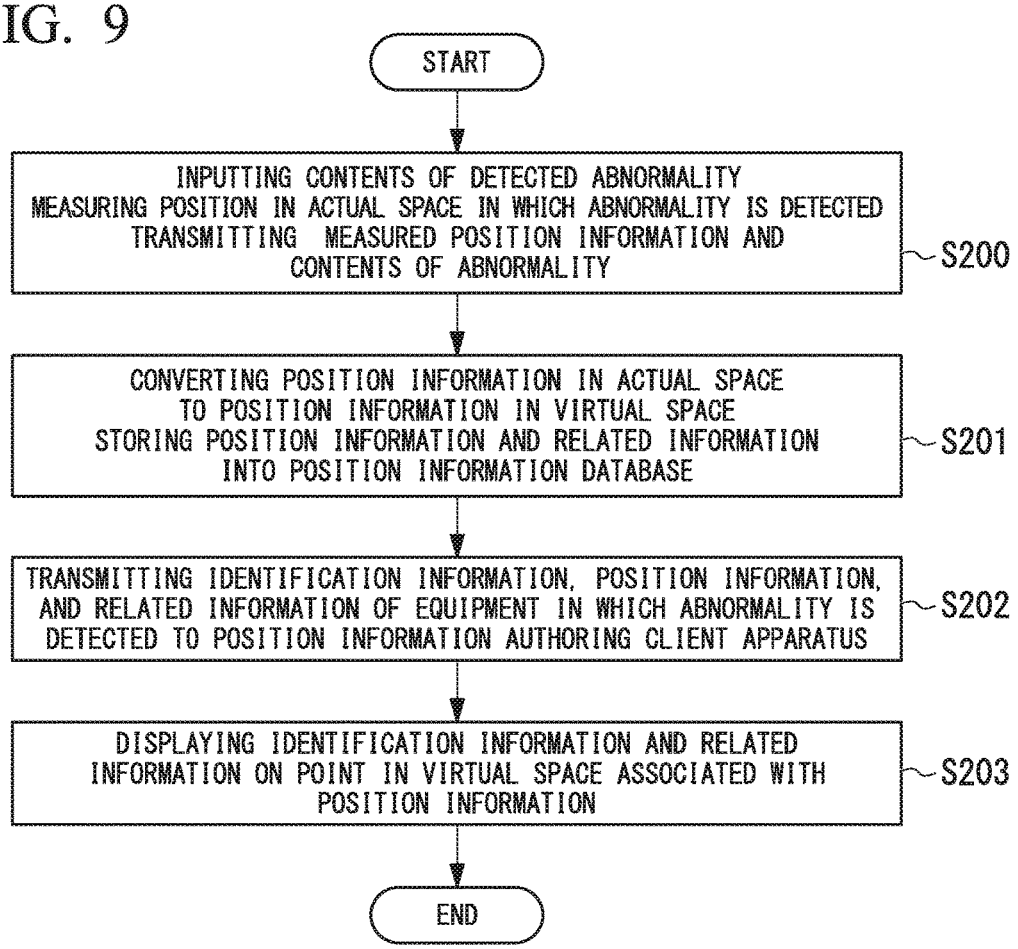
FIG. 9 is a flowchart showing a procedure of a second operation example in a plant using the position information authoring system according to the embodiment.
Figure 10:
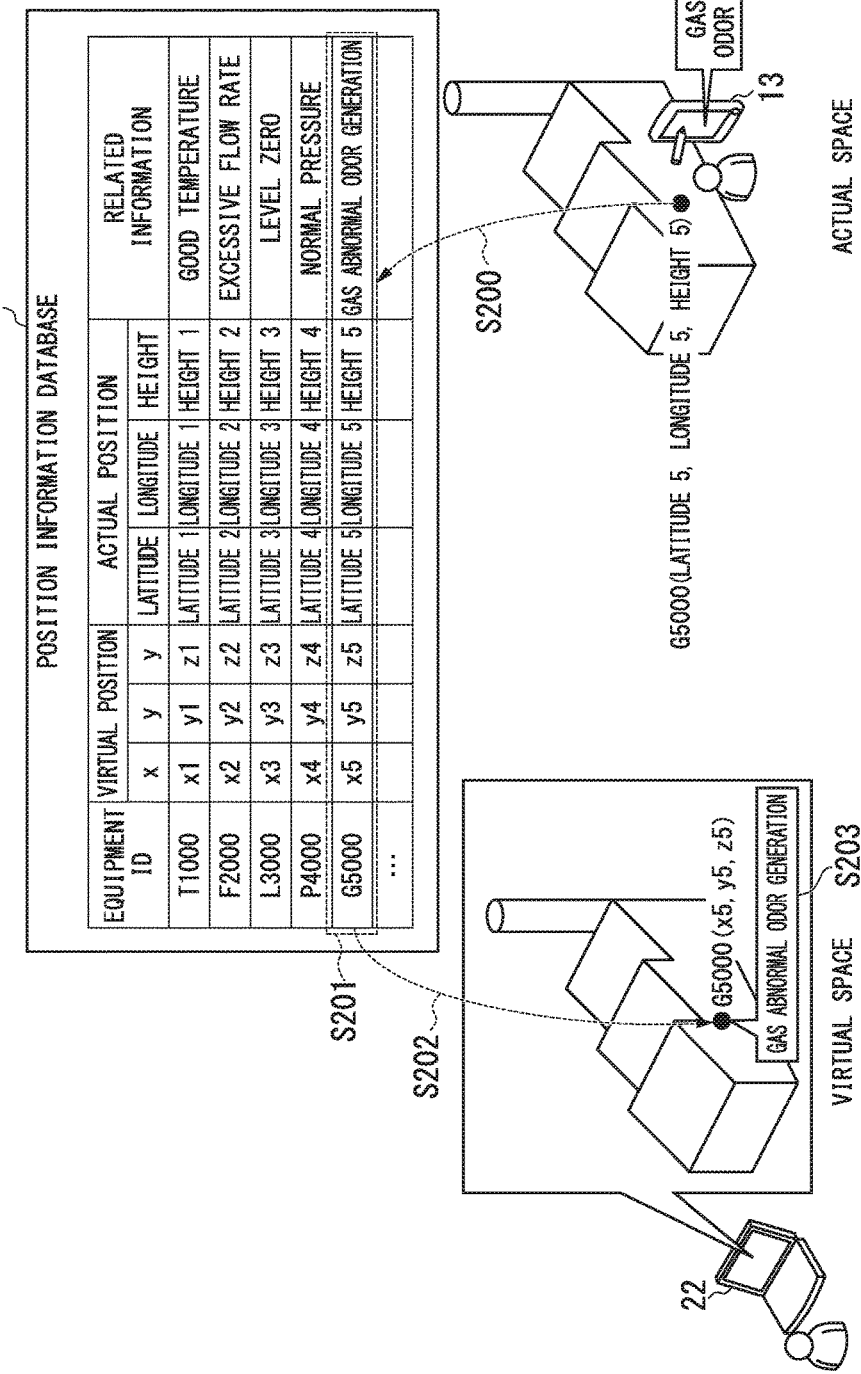
FIG. 10 is a diagram schematically showing operations of the second operation example in the plant using the position information authoring system according to the embodiment.

Next, another operation example in a plant using the position information authoring system 1 according to the present embodiment will be described. FIG. 9 is a flowchart showing a procedure of the second operation example in the plant using the position information authoring system 1 according to the present embodiment. FIG. 10 is a diagram schematically showing operations of the second operation example in the plant using the position information authoring system 1 according to the present embodiment. Hereinafter, the procedure of the second operation example shown in FIG. 9 will be described with reference to the operations of the second operation example shown in FIG. 10.

The second operation example is an example of method for notifying a manager of abnormalities in equipment detected by a worker carrying the mobile terminal device 13 and moving in the plant. A description will be provided for the case in which the worker finds an abnormality in equipment, which is not a work target, and notifies the contents of the abnormality by the mobile terminal device 13. In this case, the position information authoring system 1 performs a process in accordance with the following procedures. Also, in the following description, in order to simplify the description, hereinafter, a description will be provided for the case in which the position information device 10 and the position information authoring apparatus 20 directly communicate with each other.

(Step S200)

When the worker carrying mobile terminal device 13 and moving in the plant detects an abnormality in equipment, the worker inputs the contents of the abnormality by operating the mobile terminal device 13. In the example shown in FIG. 10, the case in which the abnormality in the equipment, to which an equipment ID "G5000" is assigned, is detected, and the contents of the abnormality, i.e. the related information (for example, comment text "Gas Abnormal Odor Generation") is input is shown. The mobile terminal device 13 stores the input related information and measures the current position of the mobile terminal device 13 by the measuring device 132. In the example shown in FIG. 10, the case is shown in which the actual position (latitude 5, longitude 5, height 5) of the equipment, to which the equipment ID "G5000" is assigned, is measured. The mobile terminal device 13 transmits the current position information of the measured mobile terminal device 13 and the information of the stored abnormal contents to the position information server apparatus 21. Specifically, the measured mobile terminal device 13 transmits the measured current position (latitude 5, longitude 5, height 5) and the input text data "Gas Abnormal Odor Generation") to the position information server apparatus 21 via the backbone network 40.

(Step S201)

The position information server apparatus 21 converts the position in the actual space transmitted from the mobile terminal device 13 into a coordinate in the virtual space. In the example shown in FIG. 10, the case in which the actual position (latitude 5, longitude 5, height 5) is converted into the virtual position (x5, y5, z5). The position information server apparatus 21 stores the information transmitted from the mobile terminal device 13 as the related information of the position information data associated with the converted virtual position (x5, y5, z5). In other words, the position information data associated with the measuring device 11 in which the abnormality is detected is changed (updated). In the example shown in FIG. 10, the case in which the text data "Gas Abnormal Odor Generation" is stored as the related information associated with the portion information data of the equipment, to which the equipment ID "G5000" associated with the virtual position (x5, y5, z5) is assigned, is shown.

(Step S202)

The position information server apparatus 21 transmits the identification information of the equipment in which the position information data is changed (updated), the position in the virtual space (coordinate), and the related information, to the position information authoring client apparatus 22. In the example shown in FIG. 10, the case is shown in which the position information server apparatus 21 transmits the identification information identifying the equipment in which the position information data is changed (updated), i.e. the equipment ID "G5000", the virtual position (x5, y5, z5), and the related information, i.e. the text data "Gas Abnormal Odor Generation".

(Step S203)

The position information authoring client apparatus 22, which receives from the position information server apparatus 21 the identification information of the equipment in which the position information data is changed (updated), the position in the virtual space (coordinate), and the related information, displays the received identification information and related information above the point of the transmitted position (coordinate) in the virtual space in the three-dimensional plant model displayed on the display 2251, to provide them to the manager. Thereby, based on the provided information, the instructions or work procedures for performing appropriate handling for the equipment in which the abnormality is detected, in other words, the equipment to which the equipment ID "G5000" is assigned, can be notified to, for example, the worker who detects the abnormality.

In accordance with such procedures, in the position information authoring system 1, the abnormalities in the equipment arranged in the plant detected by the worker carrying the mobile terminal device 13 and moving in the plant can be notified to the manager. Thereby, in the plant using the position information authoring system 1, works for handling troubles in the equipment can be promptly performed, and safety operations of each equipment can be continued. The procedures to be performed by the manager after the step S203 in the second operation example are similar to those of the first operation example. Therefore, the detail description of the process to be performed by the manager after the step S203 in the second operation example is omitted.

In the second operation example, similar to the first operation example, the manager transmits, in addition to the instructions or procedures, the three-dimensional plant model to the mobile terminal device 13, and thereby can make the mobile terminal device 13 perform the drawing of the augmented reality based on the three-dimensional plant model. At this time, if there is a difference between the current position in the three-dimensional plant model displayed on the display 1351 by the drawing of the augmented reality and the actual position, in other words, there is an error, the worker carrying the mobile terminal device 13 may operate the mobile terminal device 13 to correct the difference (error). In this case, the mobile terminal device 13 may display the difference correction performed by worker's operation during a predetermined period. The display period of the difference correction may include, for example, a period from the correction to the completion of the work in this time by the worker, a period from the correction to the switching off of the power source of the mobile terminal device 13, a period from the correction to the start of charge while keeping the power source of the mobile terminal device 13 on (the period corresponds to a period from the correction to the completion of the work in this time by the worker), and the like.

When the correction of the difference is performed by the worker's operation, the mobile terminal device 13 may transmit the corrected position information, i.e. the error information to the position information server apparatus 21. Thereby, the position information server apparatus 21 can correct the difference included in each position information data stored in the position information database 214. The position information server apparatus 21 may correct the difference when the coordinate converter 213 mutually converts the absolute position (latitude, longitude, height) and the virtual position (coordinate). Thereby, the information server apparatus 21 can identify the position in the actual space (absolute position) and the position (coordinate) in the virtual space with a high degree of accuracy. In addition, the information server apparatus 21 may notify the manager or model creator that there is a difference (error) between the three-dimensional plant model and the actual position. Thereby, the model creator can edit (modify) and update the three-dimensional plant model so that the difference from the actual position is resolved.

The correction (edit) of the difference (error) with respect to the position information data or the three-dimensional plant model may be performed depending on error information transmitted from one mobile terminal device 13 at once. The correction may be performed after collecting error information transmitted from a plurality of mobile terminal devices 13 or a plurality of error information transmitted from one mobile terminal device 13 more than one. In this case, a modification (edit) based on the average of differences (errors) in any direction included in the information of plural errors, or a modification (edit) based on the comprehensive determination of each difference (error) may be performed.

Third Operation Example

Figure 11:
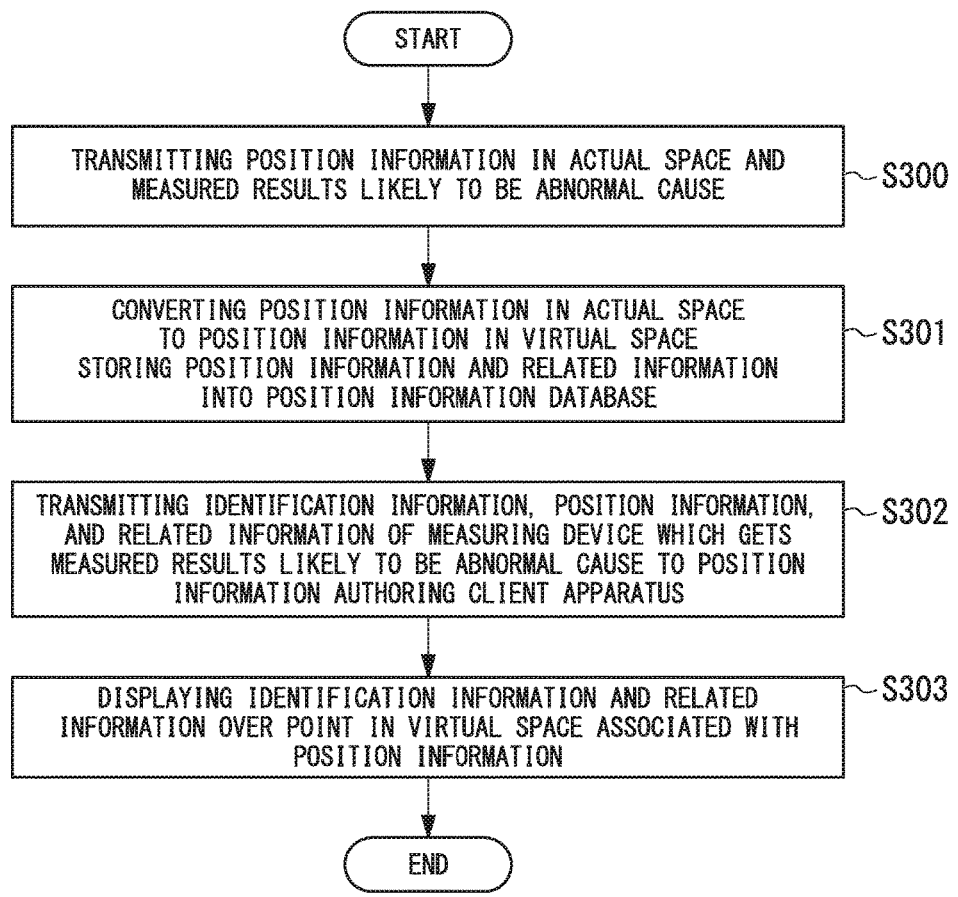
FIG. 11 is a flowchart showing a procedure of a third operation example in a plant using the position information authoring system according to the embodiment.
Figure 12:
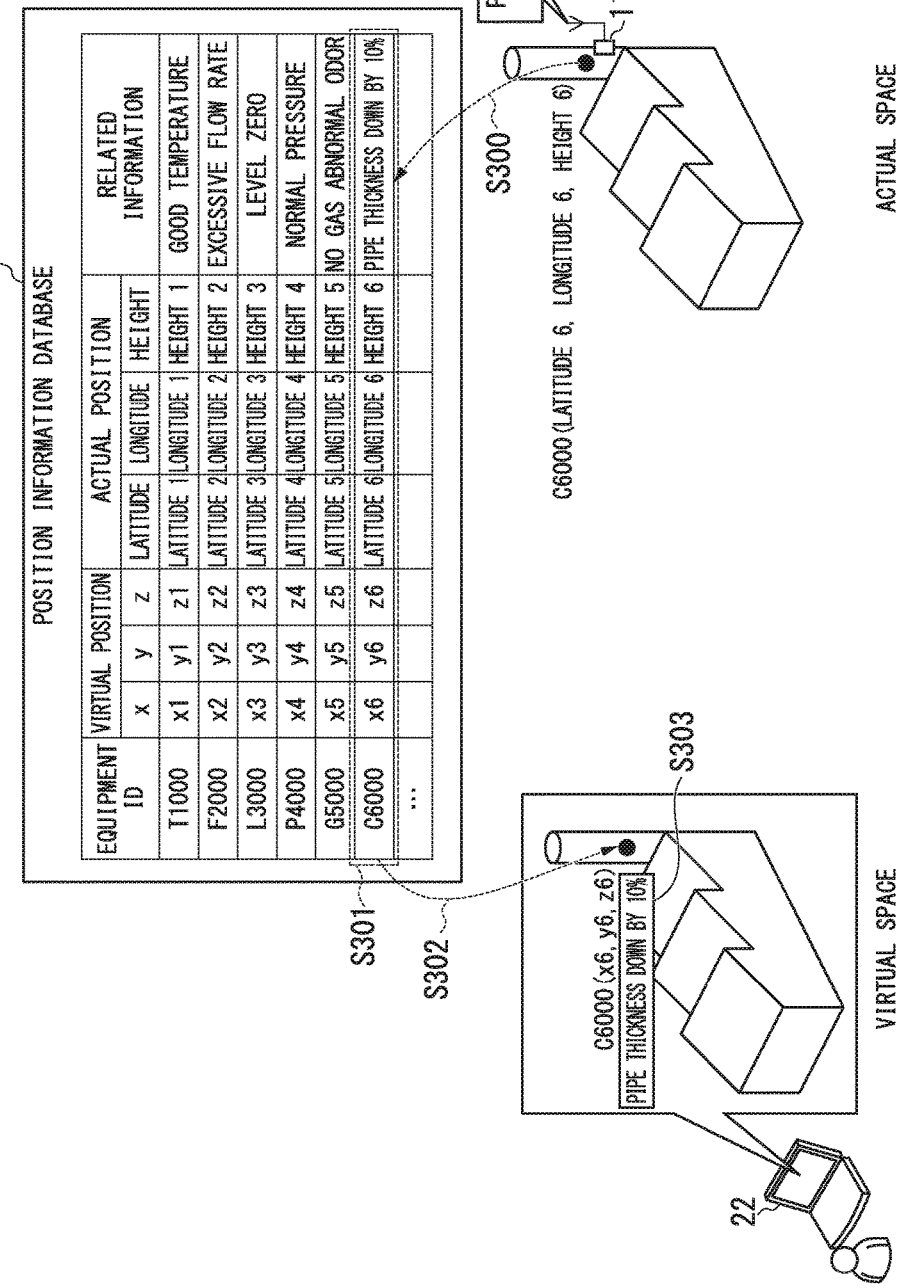
FIG. 12 is a diagram schematically showing operations of the third operation example in the plant using the position information authoring system according to the embodiment.

Next, still another operation example in a plant using the position information authoring system 1 according to the present embodiment will be described. FIG. 11 is a flowchart showing procedures of the third operation example in the plant using the position information authoring system 1 according to the present embodiment. FIG. 12 is a diagram schematically showing operations of the third operation example in the plant using the position information authoring system 1 according to the present embodiment. Hereinafter, the procedure of the third operation example shown in FIG. 11 will be described with reference to the operations of the third operation example shown in FIG. 12.

The third operation example is an example of method for notifying a manager of changes in a state of a productive equipment by the measuring device 11 installed in the productive equipment arranged in the plant. The measuring device 11 periodically or continuously measures the state of the installed productive equipment, and transmits the measured results to the position information server apparatus 21. Hereinafter, the case in which the measured results transmitted from the measuring device 11 indicate a possibility of causing an abnormality will be described. In this case, the position information authoring system 1 performs a process in accordance with the following procedures. Also, in the following description, in order to simplify the description, hereinafter, a description will be provided for the case in which the position information device 10 and the position information authoring apparatus 20 directly communicate with each other.

(Step S300)

The position information server apparatus 21 reflects the measured result transmitted from each measuring device 11 installed in the productive equipment arranged in the plant to the associated position information data. Specifically, the position information server apparatus 21 updates the related information associated with the position information data with the measured result transmitted from each measuring device 11 based on the position information in the actual space transmitted from each measuring device 11. In the example shown in FIG. 12, the case is shown in which the measuring device 11 transmits the installed actual position (latitude 6, longitude 6, height 6) and the measured result indicating a possibility of causing an abnormality. The measuring device 11 is installed in the productive equipment, to which an equipment ID "C6000" is assigned, and detects corrosion of pipe caused by ultrasonic waves or changes in magnetic field. In this case, the measuring device 11 transmits a text data "Pipe Thickness own by 10%" as the measured result.

(Step S301)

The position information server apparatus 21 converts the position in the actual space transmitted from the measuring device 11 into a coordinate in the virtual space. In the example shown in FIG. 12, the case in which the actual position (latitude 6, longitude 6, height 6) is converted into the virtual position (x6, y6, z6). The position information server apparatus 21 stores the measured result transmitted from the measuring device 11 as the related information of the position information data associated with the converted virtual position (x6, y6, z6) to change (update) the position information data associated with the measuring device 11. In the example shown in FIG. 12, the case is shown in which the text data of the measured result "Pipe Thickness own by 10%" is stored as the related information associated with the portion information data of the measuring device 11, to which the equipment ID "C6000" associated with the virtual position (x6, y6, z6) is assigned.

(Step S302)

The position information server apparatus 21 transmits the identification information of the measuring device 11 in which the position information data is changed (updated), the position in the virtual space (coordinate), and the related information, to the position information authoring client apparatus 22. If the position information server apparatus 21 receives from the measuring device 11 measured results indicating an abnormality, measured results, which do not indicate a possibility of causing an abnormality, in other words, which indicates a normality, the position information server apparatus 21 does not transmit the identification information of the measuring device 11 in which the position information data is changed (updated), the position in the virtual space (coordinate), and the related information, to the position information authoring client apparatus 22 In the example shown in FIG. 12, the case is shown in which the position information server apparatus 21 transmits the identification information identifying the measuring device 11 in which the position information data is changed (updated), i.e. the equipment ID "C6000", the virtual position (x6, y6, z6), and the related information, i.e. the text data "Pipe Thickness own by 10%".

(Step S303)

The position information authoring client apparatus 22, which receives from the position information server apparatus 21 the identification information of the measuring device 11 in which the position information data is changed (updated), the position in the virtual space (coordinate), and the related information, displays the received identification information and related information above the point of the transmitted position (coordinate) in the virtual space in the three-dimensional plant model displayed on the display 2251, to provide them to the manager. Thereby, based on the provided information, the manager transmits, in addition to the identification information and the related information, instructions or work procedures for performing appropriate handling for equipment to, for example, the mobile terminal device 13 in the vicinity of the measuring device 11. In the equipment, the measuring device 11, to which the equipment ID "C6000" is assigned, in other words, the measuring device 11 transmitting the measured result indicating a possibility of causing an abnormality, is installed. Thereby, based on the provided instructions or work procedures, the worker carrying the mobile terminal device 13 and moving in the plant can visit the equipment in which the measuring device 11 transmitting the measured result indicating a possibility of causing an abnormality is installed, and performs the instructed work (for example, confirmation work whether there is a hole in a pipe).

In accordance with such procedures, in the position information authoring system 1, based on the measured result transmitted from each measuring device 11 installed in the productive equipment arranged in the plant, the information of the measuring device 11 which transmits the measured result indicating an abnormality or the measured result indicating a possibility of causing an abnormality can be notified to the manager. Thereby, in the plant using the position information authoring system 1, the measured results of the measuring device 11 installed at a plurality of positions are managed, and thereby a possibility of causing an abnormality in the equipment can be promptly detected and inspection works or maintenance works for continuously operating each equipment can be promptly performed. In addition, in the plant using the position information authoring system 1, a possibility of causing an abnormality in equipment is promptly detected and maintenance works is promptly performed, and thereby the risk that equipment is unexpectedly stopped can be reduced. If, in addition to the above-described measuring device 11 for measuring the operation status of each equipment, another measuring device 11 for monitoring the process of each equipment is installed in the plant using the position information authoring system 1, the risk that process is unexpectedly stopped can be reduced by associating the measured results of the measuring device 11 and the work results of the inspection works in each process with the position information and controlling them. The procedures to be performed by the manager after the step S303 in the third operation example are similar to those of the first operation example. Therefore, the detail description of the process to be performed by the manager after the step S303 in the third operation example is omitted.

In the third operation example, the position information in the actual space is transmitted from the measuring device 11 installed in each equipment in the actual space. Therefore, if there is a difference between the position in the actual space in which the measuring device 11 is installed and the position in the virtual space of each equipment 11 (also including the position information output device 12) marked in the three-dimensional plant model, i.e. there is an error, the position information server apparatus 21 can correct the difference included in each position information data stored in the position information database 214. The position information server apparatus 21 may correct the difference when the coordinate converter 213 mutually converts the absolute position (latitude, longitude, height) and the virtual position (coordinate). Thereby, the information server apparatus 21 can identify the position (absolute position) in the actual space and the position (coordinate) in the virtual space with a high degree of accuracy. In addition, the information server apparatus 21 may notify the manager or model creator that there is a difference (error) between the position in the virtual space in the three-dimensional plant model and the position in the actual space transmitted from the measuring device 11 (also including the position information output device 12). Thereby, the model creator can edit (modify) and update the three-dimensional plant model so that the difference from the position in the actual space is resolved.

The correction (edit) of the difference (error) with respect to the position information data or the three-dimensional plant model may be performed depending on position information transmitted from one measuring device 11 (also including the position information output device 12) at once. The correction may be performed after collecting position information transmitted from a plurality of measuring devices 11 (also including the position information output device 12) or a plurality of position information transmitted from one mobile terminal device 13 more than one. In this case, a modification (edit) based on the average of differences (errors) in any direction included in plural position information, or a modification (edit) based on the comprehensive determination of each difference (error) may be performed.

As described above, in the position information authoring system 1, the virtual circumstances based on the created three-dimensional plant model can be used to support various works for operating each equipment actually installed in the plant. Thereby, in the plant employing the position information authoring system 1, the various effects such as continuous operations of productive equipment, reduction of unexpected stop of equipment can be achieved.

As the operation example using the position information authoring system 1, the first to third operation examples have been described. In addition to the first to third operation examples, the position information authoring system 1 can be used to support various works in a plant. For example, in a chemical plant or a petroleum plant in which a plurality of pipes or tanks are arranged, a platform on the sea in which hard work circumstance is expected, or the like, it is considered that works in a work site involve some danger. If the measured result indicating that a worker is subject to danger is transmitted from the measuring device 11 installed in equipment, in accordance with similar procedures to those in the first operation example, alarms or related information for encouraging attention can be transmitted to the mobile terminal device 13 in the vicinity of the measuring device 11. Thereby, it is possible to ensure the safety of the worker carrying the mobile terminal device 13 and moving in the plant. At the same time, by making the mobile terminal device 13 perform the augmented reality drawing based on the three-dimensional plant model, an evacuation area, an escape route, and the like can be visually provided to the worker. As described above, by using the position information authoring system 1, the safety of workers in a work site can be improved.

In the position information authoring system 1, measured results, work results, know-how for work, and the like can be associated with the position information and be shared. Thereby, in the position information authoring system 1, the technique succession and improvement between workers are performed and the work efficiency in an actual work site is improved, and thereby the cost of plant operations can be reduced.

In the operation example, the case has been described in which workers perform works in a work site. It is considered that, in a place which a human cannot enter, for example, a mobile robot performs works. In this case, using the position information authoring system 1, it is possible to instruct a movement path of the mobile robot based on the three-dimensional plant model identified with respect to the position in the actual space.

As described above, according to the present embodiment, the three-dimensional plant model virtually representing the arrangement or circumstance of equipment in an actual plant is created, and the actual position (absolute position) of equipment or a device in an actual space and the virtual position (coordinate) of equipment or a device in the three-dimensional plant model are mutually converted and identified. Therefore, in the present embodiment, each position in the plant is accurately reflected to the three-dimensional plant model. In the present embodiment, the related information associated with the equipment or device in the actual space is associated with the position identified based on the actual space and the virtual space, and controlled. Therefore, in the present embodiment, the management of the equipment or device in the actual space can be realized by performing management with respect to the virtual equipment or device represented in the three-dimensional plant model. Thereby, in the present embodiment, the various effects such as improvement of work efficiency in an actual work site in a plant, improvement of safety, continuous operations of productive equipment, reduction of unexpected stop of equipment can be achieved.

In the present embodiment, the case has been described in which the position information relay device 30 transfers the position information transmitted from the associated position information device 10 to the position information authoring apparatus 20. However, the position information transmitted from the position information device 10 includes identification information for identifying each position information device 10. Therefore, for example, if the position information device 10 is a device installed (anchored) at a predetermined position such as a measuring device 11 or a position information output device 12, it is also considered that the position information transmitted from the position information device 10 always indicate the same position. Therefore, each relay device included in the position information relay device 30 determines a position of each position information device 10 based on the identification information of the position information device 10, and transfers the determined position information along with the measured results transmitted from each position information device 10, and the like, to the position information authoring apparatus 20.

In the present embodiment, the case has been described in which each position information device 10 transmits the position information to the position information authoring apparatus 20 via some relay device included in the position information relay device 30. However, each position information device 10 may include a device for directly transmitting position information or measured results to the position information authoring apparatus 20.

For example, the above-described various processes of the position information authoring system 1 according to the present embodiment may be implemented by recording a program for implementing a process of each component in the position information device 10 or the position information authoring apparatus 20 into a computer readable storage medium, making a computer system read the program stored in the storage medium, and executing the program. The "computer system" may include an operating system and a hardware such as a peripheral device. If the World Wide Web is used, the "computer system" may include an environment for providing homepage (or display environment). The "computer readable storage medium" indicates a portable medium such as a flexible disk, a magnetic optical disk, a read-only memory (ROM), a writable non-volatile memory such as a flash memory, a CD-ROM and a storage device such as a hard-disk embedded in a computer system.

In addition, the "computer readable storage medium" may include a medium for storing a program for a given length of time like a volatile memory (for example, a Dynamic Random Access Memory (DRAM)) embedded in a computer system, which is a server or client when a program is transmitted via a communication line such as a network including the Internet and a phone line. The above-described program may be transferred, from the computer system stored in the storage device, to another computer system, via a transmission medium, or by transmission waves in the transmission medium. The "transmission medium" that transmits the program means a medium having a function to transmit information, such as a network (communication net) like the Internet, or a communication line (communication wire) like a phone line like. The above-described program may be used to implement a part of the above-described functions. In addition, the above-described program may implement the above-described functions in cooperation with another program previously stored in the computer system, so-called difference file (difference program).

The position information device 10 or the position information authoring apparatus 20 included in the position information authoring system 1 may include, but is not limited to: one or more software components; and one or more hardware processors that are, when executing one or more software components, configured to implement each function of the position information device 10 or the position information authoring apparatus 20. Alternatively, each function of the position information device 10 or the position information authoring apparatus 20 may be implemented by circuitry.

The hardware processor" may be implemented by one or more hardware components. The hardware processor is configured to execute one or more software components and configured, when executing the one or more software components, to perform one or more acts or operations in accordance with codes or instructions included in the one or more software components.

The "circuitry" refers to a system of circuits which is configured to perform one or more acts or operations. The term "circuitry" is implemented by hardware and software components.

Although the foregoing has been a description of the embodiment of the present invention with reference to the drawings, the specific configuration of the present invention is not limited to the embodiments described above, and can be freely modified within the scope of the present invention.

What is claimed is:

1. A position information authoring system comprising a plurality of position information devices in a plant and a position information authoring apparatus, wherein each of the plurality of position information devices is configured to input a position information into the position information authoring apparatus, the position information represents a three-dimensional absolute position in an actual space of each of the plurality of position information devices, the position information comprises identification information for identifying each of the plurality of position information devices, the position information authoring apparatus is configured to manage a physical position of each physical equipment in the plant and physical positions of the plurality of position information devices, based on a three-dimensional plant model which comprises virtual equipments and marks a virtual position of each of the plurality of position information devices, each of the plurality of position information devices includes at least one of a measuring device and a mobile terminal device, the measuring device is configured to measure operation state of the physical equipment at which the measuring device is installed and to input measured results and the position information into the position information authoring apparatus, the mobile terminal device is configured to display works with respect to the equipment and to input work results of the works and the position information into the position information authoring apparatus, each of the plurality of position information devices is configured to output related information to the position information authoring apparatus, the related information represents at least one of information input into the virtual position in the three-dimensional plant model, the measured results, and the work results, and if the related information is input into the position information authoring apparatus, the position information authoring apparatus displays, in the three-dimensional plant model, the identification information, the related information, and position information representing a position in the three-dimensional plant model which corresponds to the position information representing a position in the actual space of the position information device which has output the related information.

2. The position information authoring system according to claim 1, wherein the position information authoring apparatus is configured to identify a three-dimensional coordinate representing the virtual position of the virtual equipment or the virtual position of each of the plurality of position information devices and the position information output from each of the plurality of position information devices, and to manage the physical position of the physical equipment and the physical positions of the plurality of position information devices based on the identified coordinate.

3. The position information authoring system according to claim 2, wherein the position information authoring apparatus comprises:
a position information acquirer configured to acquire the position information from the plurality of position information devices;
a coordinate converter configured to mutually convert the virtual position represented by the coordinate extracted from the three-dimensional plant model and the three-dimensional absolute position included in the position information to identify the virtual position and the physical position;
a three-dimensional model data storage storing the three-dimensional plant model; and a position information database storing position information data in which the virtual position and the physical position are associated with each other, the virtual position and the actual position being identified by the coordinate converter for each equipment and each of the plurality of position information devices.

4. The position information authoring system according to claim 3, wherein
the position information authoring apparatus is configured to display the related information associated with the position information data at the associated virtual position in the three-dimensional plant model.

5. The position information authoring system according to claim 3, wherein
each of plurality of position information devices includes:
a mobile terminal device configured to display works with respect to the equipment and to input work results of the works and the position information into the position information authoring apparatus, and
the position information authoring apparatus is configured to associate and store related information with the position information data, the related information including at least one of information input into the virtual position in the three-dimensional plant model and the work results.

6. The position information authoring system according to claim 5, wherein
the position information authoring apparatus is configured to input the related information associated with the position information data into the mobile terminal device adjacent to the physical position associated with the position information data, and
the mobile terminal device is configured to display the related information output from the position information authoring apparatus.

7. The position information authoring system according to claim 5, wherein
the mobile terminal device is configured to display the three-dimensional plant model output from the position information authoring apparatus and to input, into the position information authoring apparatus, a modification information for modifying a display position which is input with respect to the displayed three-dimensional plant model, and
the position information authoring apparatus is configured to modify the identified virtual position and physical position based on the modification information.

8. The position information authoring system according to claim 1, wherein
the mobile terminal device comprises:
a measure configured to measure the three-dimensional absolute position based on radio waves emitted from positioning satellites, and
the mobile terminal device is configured to input the absolute position measured by the measure as the position information into the position information authoring apparatus.

9. The position information authoring system according to claim 3, wherein
the coordinate converter is configured to mutually convert the coordinate extracted from the three-dimensional plant model and a set of latitude, longitude, and height included in the position information.

10. A position information authoring apparatus configured to manage a physical position of each physical equipment in a plant and physical positions of a plurality of position information devices based on a three-dimensional plant model, wherein
each of the plurality of position information devices is configured to input a position information into the position information authoring apparatus, the position information represents a three-dimensional absolute position in an actual space of each of the plurality of position information devices, the position information comprises identification information for identifying each of the plurality of position information devices,
the position information authoring apparatus is configured to manage a physical position of each physical equipment in the plant and physical positions of the plurality of position information devices, based on the three-dimensional plant model comprising virtual equipments and marking a virtual position of each of the plurality of position information devices,
each of the plurality of position information devices includes at least one of a measuring device and a mobile terminal device, the measuring device is configured to measure operation state of the physical equipment at which the measuring device is installed and to input measured results and the position information into the position information authoring apparatus, the mobile terminal device is configured to display works with respect to the equipment and to input work results of the works and the position information into the position information authoring apparatus,
each of the plurality of position information devices is configured to output related information to the position information authoring apparatus, the related information represents at least one of information input into the virtual position in the three-dimensional plant model, the measured results, and the work results, and
if the related information is input into the position information authoring apparatus, the position information authoring apparatus displays, in the three-dimensional plant model, the identification information, the related information, and position information representing a position in the three-dimensional plant model which corresponds to the position information representing a position in the actual space of the position information device which has output the related information.

11. The position information authoring apparatus according to claim 10, wherein
the position information authoring apparatus is configured to identify a three-dimensional coordinate representing the virtual position of the virtual equipment or the virtual position of each of the plurality of position information devices and the position information output from each of the plurality of position information devices, and to manage the physical position of the physical equipment and the physical positions of the plurality of position information devices based on the identified coordinate.

12. The position information authoring apparatus according to claim 11, wherein
the position information authoring apparatus comprises:
a position information acquirer configured to acquire the position information from the plurality of position information devices;
a coordinate converter configured to mutually convert the virtual position represented by the coordinate extracted from the three-dimensional plant model and the three-dimensional absolute position included in the position information to identify the virtual position and the physical position;

a three-dimensional model data storage storing the three-dimensional plant model; and a position information database storing position information data in which the virtual position and the physical position are associated with each other, the virtual position and the actual position being identified by the coordinate converter for each equipment and each of the plurality of position information devices.

13. The position information authoring apparatus according to claim 12, wherein the position information authoring apparatus is configured to display the related information associated with the position information data at the associated virtual position in the three-dimensional plant model.

14. A position information authoring method, comprising:

acquiring position information from a plurality of position information devices in a plant, the position information representing a three-dimensional absolute position in an actual space of each of the plurality of position information devices, the position information comprising identification information for identifying each of the plurality of position information devices; and managing a physical position of each physical equipment in the plant and physical positions of the plurality of position information devices based on a three-dimensional plant model, the three-dimensional plant model comprising virtual equipments and marking a virtual position of each of the plurality of position information devices, wherein each of the plurality of position information devices includes at least one of a measuring device and a mobile terminal device, and wherein the position information authoring method further comprises:

measuring, by the measuring device, operation state of the physical equipment at which the measuring device is installed;

inputting, by the measuring device, measured results and the position information into the position information authoring apparatus;

displaying, by the mobile terminal device, works with respect to the equipment;

inputting, by the mobile terminal device, work results of the works and the position information into the position information authoring apparatus;

outputting, by each of the plurality of position information devices, related information to the position information authoring apparatus, the related information representing at least one of information input into the virtual position in the three-dimensional plant model, the measured results, and the work results; and if the related information is input into the position information authoring apparatus, displaying in the three-dimensional plant model, by the position information authoring apparatus, the identification information, the related information, and position information representing a position in the three-dimensional plant model which corresponds to the position information representing a position in the actual space of the position information device which has output the related information.

15. The position information authoring method according to claim 14, wherein managing the physical position of each physical equipment in the plant and the physical positions of the plurality of position information devices comprises:

identifying a three-dimensional coordinate representing the virtual position of the virtual equipment or the virtual position of each of the plurality of position information devices and the position information output from each of the plurality of position information devices; and managing the physical position of the physical equipment and the physical positions of the plurality of position information devices based on the identified coordinate.

16. The position information authoring method according to claim 15, wherein managing the physical position of each physical equipment in the plant and the physical positions of the plurality of position information devices comprises:

acquiring the position information from the plurality of position information devices;

converting the virtual position represented by the coordinate extracted from the three-dimensional plant model and the three-dimensional absolute position included in the position information mutually to identify the virtual position and the physical position;

storing the three-dimensional plant model; and storing position information data in which the identified virtual position and physical position are associated with each other for each equipment and each of the plurality of position information devices.

17. The position information authoring method according to claim 16, further comprising:

displaying the related information associated with the position information data at the associated virtual position in the three-dimensional plant model.

* * * * *